United States Patent
Ji

(10) Patent No.: US 9,570,608 B2
(45) Date of Patent: Feb. 14, 2017

(54) TRANSISTOR, METHOD FOR FABRICATING THE SAME, AND ELECTRONIC DEVICE INCLUDING THE SAME

(71) Applicant: SK hynix Inc., Gyeonggi-do (KR)

(72) Inventor: Yun-Hyuck Ji, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 93 days.

(21) Appl. No.: 14/220,920

(22) Filed: Mar. 20, 2014

(65) Prior Publication Data

US 2015/0129931 A1    May 14, 2015

(30) Foreign Application Priority Data

Nov. 11, 2013  (KR) ........................ 10-2013-0136381

(51) Int. Cl.
| | |
|---|---|
| H01L 29/78 | (2006.01) |
| H01L 27/092 | (2006.01) |
| H01L 21/8238 | (2006.01) |
| H01L 21/28 | (2006.01) |
| H01L 29/49 | (2006.01) |
| H01L 29/66 | (2006.01) |

(52) U.S. Cl.
CPC ..... *H01L 29/7842* (2013.01); *H01L 21/28052* (2013.01); *H01L 21/823807* (2013.01); *H01L 21/823842* (2013.01); *H01L 27/092* (2013.01); *H01L 29/4925* (2013.01); *H01L 29/4933* (2013.01); *H01L 29/665* (2013.01); *H01L 29/6659* (2013.01); *H01L 29/785* (2013.01); *H01L 29/7845* (2013.01)

(58) Field of Classification Search
CPC ............. H01L 29/7842; H01L 29/7845; H01L 29/7847; H01L 29/4933; H01L 29/4925
See application file for complete search history.

(56) References Cited

U.S. PATENT DOCUMENTS

| | | | |
|---|---|---|---|
| 6,208,003 B1 * | 3/2001 | Miura | ............... H01L 21/28035 257/412 |
| 6,596,605 B2 | 7/2003 | Ha et al. | |
| 7,348,636 B2 | 3/2008 | Ryu et al. | |
| 7,462,524 B1 * | 12/2008 | Peidous | ............ H01L 29/66545 438/197 |
| 7,678,630 B2 * | 3/2010 | Lindsay | ............ H01L 21/26506 257/65 |
| 8,421,130 B2 | 4/2013 | Liaw et al. | |
| 9,171,905 B2 * | 10/2015 | Ji | ........................ H01L 29/7845 |
| 2001/0015922 A1 | 8/2001 | Ponomarev | |
| 2004/0253776 A1 * | 12/2004 | Hoffmann | ......... H01L 21/28044 438/199 |

(Continued)

FOREIGN PATENT DOCUMENTS

| | | |
|---|---|---|
| KR | 1020060104398 | 10/2006 |
| KR | 1020110036312 | 4/2011 |

*Primary Examiner* — Stephen W Smoot
*Assistant Examiner* — Sun M Kim
(74) *Attorney, Agent, or Firm* — I P & T Group LLP

(57) ABSTRACT

A semiconductor device includes a stressed substrate stressed by a first stress, a first stressed channel formed in the substrate and having the first stress, and a first strained gate electrode strained by a first strain generating element. A first strained gate electrode is formed over the first stressed channel, the first strained gate electrode including a first lattice-mismatched layer to induce a second stress to the first stressed channel.

6 Claims, 24 Drawing Sheets

(56) References Cited

U.S. PATENT DOCUMENTS

2010/0078729 A1* 4/2010 Fukutome ......... H01L 21/28035
　　　　　　　　　　　　　　　　　　　　　　　　257/369
2011/0079857 A1* 4/2011 Lee ................ H01L 21/823807
　　　　　　　　　　　　　　　　　　　　　　　　257/369

* cited by examiner

TRANSISTOR, METHOD FOR FABRICATING THE SAME, AND ELECTRONIC DEVICE INCLUDING THE SAME

CROSS-REFERENCE TO RELATED APPLICATIONS

The present application claims priority of Korean Patent Application No. 10-2013-0136381, filed on Nov. 11, 2013, which is incorporated herein by reference in its entirety.

BACKGROUND

1. Field

Exemplary embodiments of the present invention relate to an electronic device, and more particularly, to a transistor, a method for fabricating the same, and an electronic device including the same.

2. Description of the Related Art

An electronic device is formed of a plurality of transistors. Recently, scaling-down of transistors is continuously progressed. In correspondence to the scaling-down, a method for improving the performance of transistors is regarded important. For example, driving current may be increased for high speed operations of transistors.

SUMMARY

Various exemplary embodiments of the present invention are directed to a transistor that may increase driving current, a method for fabricating the same, and an electronic device including the same.

In an exemplary embodiment of the present invention, a semiconductor device may include a stressed substrate stressed by a first stress, a first stressed channel formed in the substrate and having the first stress, and a first strained gate electrode strained by a first strain generating element. A first strained gate electrode is formed over the first stressed channel, the first strained gate electrode including a first lattice-mismatched layer to induce a second stress to the first stressed channel.

In another exemplary embodiment of the present invention, transistor may include an NMOSFET including a tensile strained gate electrode that has a first lattice-mismatched crystalline silicon layer and a tensile stressed channel that has a tensile stress induced by a tensile strain, and a PMOSFET including a compressive strained gate electrode that has a second lattice-mismatched crystalline silicon layer and a compressively stressed channel that has a compressive stress induced by a compressive strain. The tensile stressed channel and the compressive stressed channel are formed in a global tensile stressed substrate.

In still another exemplary embodiment of the present invention, a method for fabricating a semiconductor device may include forming a first transistor region and a second transistor region in a substrate, forming a first strained gate electrode, including a first lattice-mismatched crystalline silicon layer, over the first transistor region, forming a second strained gate electrode, including a second lattice-mismatched crystalline silicon layer, over the second transistor region, and stressing the substrate to form a stressed first transistor region and a stressed second transistor region.

According to the exemplary embodiments of the present invention, since a stressed channel is formed by a strained gate electrode in which a strain has occurred due to lattice mismatch, and a substrate with a global stress, it may be possible to improve the performance of a transistor that is extremely scaled down.

Accordingly, an electronic device including a plurality of transistors of which performance is improved by stressed channels may realize a high operation speed in correspondence to scaling-down.

DETAILED DESCRIPTION

Figure 1A:
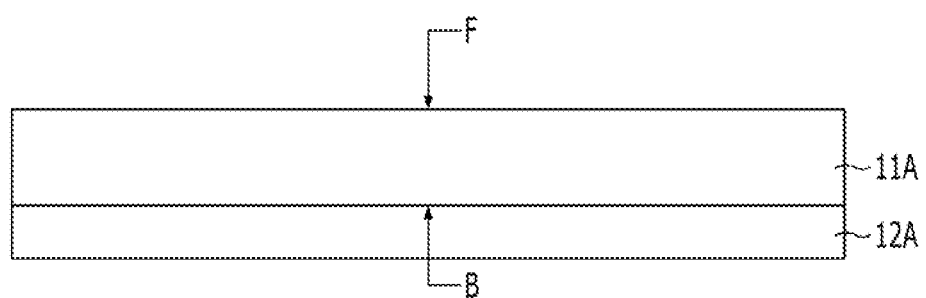
FIGS. 1A to 1D are views illustrating a stress engineering method in accordance with a first embodiment.

Various examples and embodiments of the disclosed technology are described below in detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Throughout the disclosure, reference numerals correspond directly to the like numbered parts in the various figures and exemplary embodiments of the present invention.

The drawings may not be necessarily to scale and in some instances, proportions of at least some of structures in the drawings may have been exaggerated in order to clearly illustrate certain features of the described examples or embodiments.

In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers).

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

It is also noted that in this specification, "coupled" refers to one component not only directly coupling another component but also indirectly coupling another component through an intermediate component. In addition, a singular form may include a plural form as long as it is not specifically mentioned in a sentence.

FIGS. 1A to 1D are views illustrating a stress engineering method in accordance with a first embodiment.

As shown in FIG. 1A, a substrate 11A having a front surface F and a back surface B is prepared. The substrate 11A may include a non-stressed substrate. The substrate 11A may include a silicon-containing substrate.

A sacrificial layer 12A is formed on the back surface B of the substrate 11A. The sacrificial layer 12A may include a silicon-containing material. The sacrificial layer 12A may include a silicon layer. The sacrificial layer 12A may include a silicon layer that is not doped with an impurity, that is, an undoped silicon layer. The sacrificial layer 12A may include an undoped amorphous silicon layer. While not shown, an intermediate layer may be additionally formed between the substrate 11A and the sacrificial layer 12A. The intermediate layer may include a dielectric material. The intermediate layer may include silicon oxide.

Figure 1B:
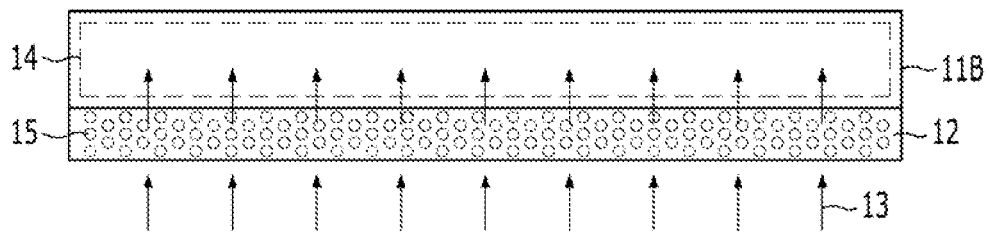

As shown in FIG. 1B, first stress converting process 13 is performed. The first stress converting process 13 is a process of inducing a first stress 14 to the substrate 11A (shown in FIG. 1A). The first stress converting process 13 may be performed by a process of doping a stress inducing element 15. The process of doping the stress inducing element 15 is performed on the back surface B of the substrate 11A. The process of doping the stress inducing element 15 is a process of doping the stress inducing element 15 into the sacrificial layer 12A. The stress inducing element 15 may include an element that has an atomic radius smaller than that of silicon. The stress inducing element 15 may include phosphorus (P). The process of doping the stress inducing element 15 includes implantation.

The sacrificial layer 12A that is doped with the stress inducing element 15 is referred to as a stress inducing element-doped sacrificial layer 12 and has the first stress 14. The first stress 14 is applied to the substrate 11A by the stress inducing element-doped sacrificial layer 12.

In this way, the first stress 14 is applied to the substrate 11A by the first stress converting process 13. For example, the first stress 14 may be a compressive stress. Thus, the substrate 11A, to which the compressive stress is applied, may become a compressively stressed substrate 11B.

Figure 1C:
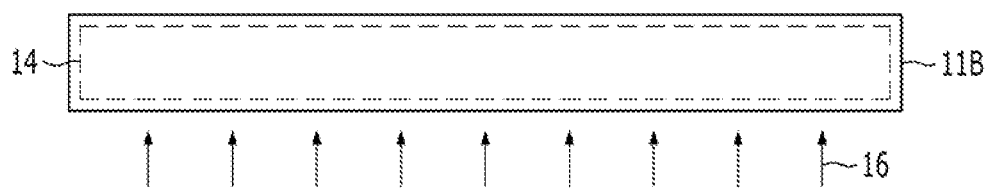

As shown in FIG. 1C, a strip process 16 is performed. By the strip process 16, the stress inducing element-doped sacrificial layer 12 that is formed on the back surface B of the compressively stressed substrate 11B is removed.

Figure 1D:
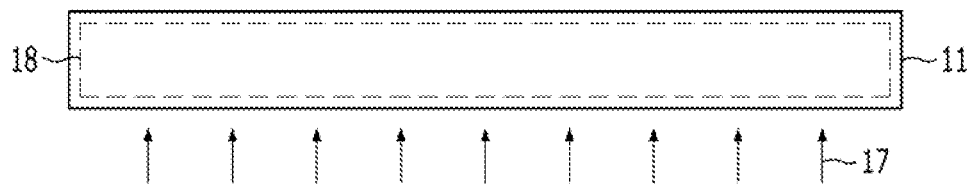

As shown in FIG. 1D, second stress converting process 17 is performed. The second stress converting process 17 is a process of converting the first stress 14 of the compressively stressed substrate 11B into a second stress 18. The second stress converting process 17 may be performed by annealing. The annealing is performed in a nitrogen atmosphere at a temperature equal to or lower than about 1000° C.

By the second stress converting process 17, the first stress 14 of the compressively stressed substrate 11B is converted into the second stress 18. For instance, the first stress 14 may be a compressive stress and the second stress 18 may be a tensile stress. Accordingly, the compressively stressed substrate 11B may become a tensile stressed substrate 11 with a tensile stress.

The compressively stressed substrate 11B may be formed by the above-described first stress converting process 13. Further, the tensile stressed substrate 11 may be formed by the second stress converting process 17.

FIGS. 2A to 2D are views illustrating a stress engineering method in accordance with a second embodiment.

Figure 2A:
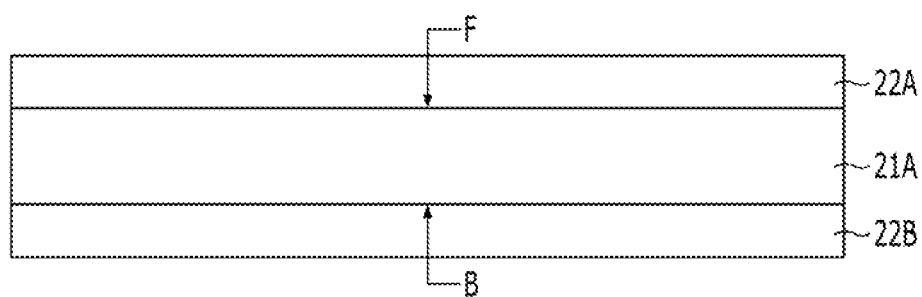
FIGS. 2A to 2D are views illustrating a stress engineering method in accordance with a second embodiment.

As shown in FIG. 2A, a substrate 21A having a front surface F and a back surface B is prepared.

Pre-layers 22A and 22B are formed on the front surface F and the back surface B of the substrate 21A, respectively. To this end, the pre-layers 22A and 22B are formed in a furnace. Hereinbelow, the pre-layer 22A formed on the front surface A of the substrate 21A is referred to as a pre-conductive layer 22A, and the pre-layer 22B formed on the back surface B of the substrate 21A is referred to as a sacrificial layer 22B. The pre-conductive layer 22A may be structured by a subsequent etching process, as explained below. The sacrificial layer 22B is removed after a stress converting process is performed. The pre-conductive layer 22A and the sacrificial layer 22B may include a silicon-containing material. The pre-conductive layer 22A and the sacrificial layer 22B may include silicon layers. The pre-conductive layer 22A and the sacrificial layer 22B may include silicon layers that are not doped with an impurity, that is, undoped silicon layers. While not shown, intermediate layers may be additionally formed between the substrate 21A and the pre-conductive layer 22A and between the substrate 21A and the sacrificial layer 22B. The intermediate layers may include a dielectric material. The intermediate layers may include silicon oxide. The intermediate layers may be formed by a thermal oxidation process.

Figure 2B:
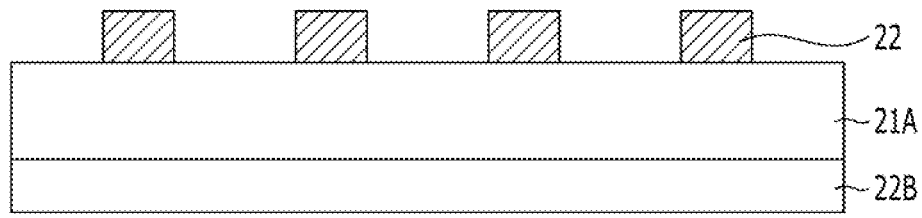

As shown in FIG. 2B, structuring of the pre-conductive layer 22A is performed. The structuring of the pre-conductive layer 22A may include a patterning process such as an etching process. For instance, structures 22 are formed by etching the pre-conductive layer 22A. The structures 22 may include silicon patterns. The sacrificial layer 22B formed on the back surface B of the substrate 21A is not structured.

Figure 2C:
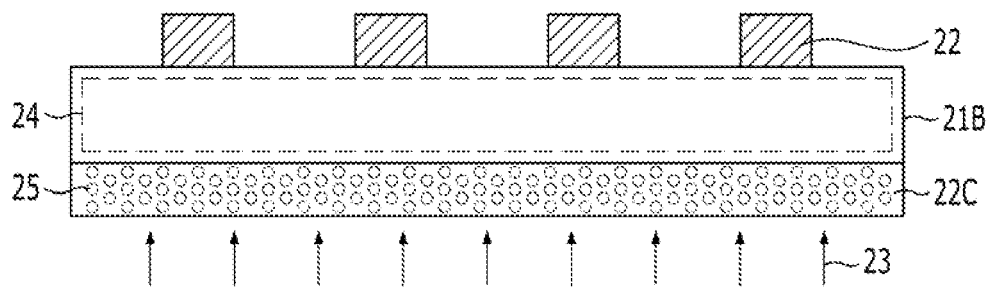

As shown in FIG. 2C, a first stress converting process 23 is performed. The first stress converting process 23 is a process of inducing a first stress 24 to the substrate 21A from the back surface B. The first stress converting process 23 may be performed by a process of doping a stress inducing element 25. The process of doping the stress inducing element 25 is a process of doping the stress inducing element 25 to the sacrificial layer 22B. The stress inducing element 25 may include an element that has an atomic radius smaller than that of silicon. The stress inducing element 25 may include phosphorus (P). The process of doping the stress inducing element 25 includes implantation. The process of doping the stress inducing element 25 is performed on the back surface B of the substrate 21A. According to this fact, the stress inducing element 25 is doped into the sacrificial layer 22B.

The sacrificial layer 22B that is doped with the stress inducing element 25 is referred to as a stress inducing element-doped sacrificial layer 22C and has the first stress 24. The first stress 24 is applied to the substrate 21A by the stress inducing element-doped sacrificial layer 22C.

In this way, the first stress 24 is applied to the substrate 21A by the first stress converting 23. For example, the first stress 24 may be a compressive stress. Thus, the substrate 21A, to which the compressive stress is applied, may become a compressive stressed substrate 21B with a compressive stress.

Figure 2D:
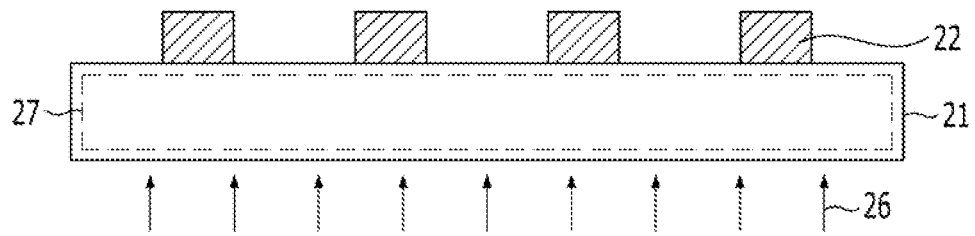

As shown in FIG. 2D, by a strip process (see the reference numeral 16 of FIG. 1C), the stress inducing element-doped sacrificial layer 22C that is formed on the back surface B of the compressive stressed substrate 21B is removed.

A second stress converting process 26 is performed. The second stress converting process 26 is a process of converting the first stress 24 of the compressive stressed substrate 21B into a second stress 27. The second stress converting 25 may be performed by annealing. The annealing is performed in a nitrogen atmosphere at a temperature equal to or lower than about 1000° C.

By the second stress converting process 26, the first stress 24 of the compressive stressed substrate 21B is converted into the second stress 27. For instance, the first stress 24 may be a compressive stress and the second stress 27 may be a tensile stress. Accordingly, the compressively stressed substrate 21B may become a stressed substrate 21 with a tensile stress.

The compressively stressed substrate 21B may be formed by the above-described first stress converting process 23. Further, the tensile stressed substrate 21 may be formed by the second stress converting process 26. Furthermore, a compressive stress or a tensile stress may be applied to the inside of the tensile stressed substrate 21 with the structures 22 formed on the front surface thereof.

In the first embodiment and the second embodiment described above, the stress of the substrates 11 and 21 will be referred to as a global stress.

Figure 3:
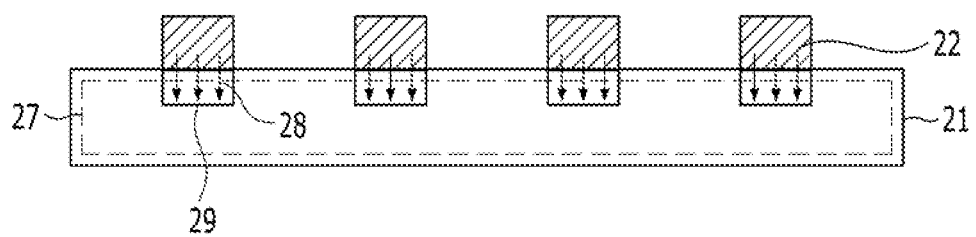
FIG. 3 is a view illustrating a stress engineering method in accordance with a third embodiment.

FIG. 3 is a view illustrating a stress engineering method in accordance with a third embodiment.

Referring to FIG. 3, similarly to the second embodiment, structures 22 are formed on a substrate 21. In this third embodiment, a local stress 28 may be applied to the substrate 21 by a process of forming the structures 22. The local stress 28 may include the same type of stress as or a different type of stress from the global stress 27. The local stress 28 is a stress that is induced by the process of forming the structures 22. In order to induce the local stress 28 in the structures 22, strains may occur in the structures 22. The strains may occur due to lattice mismatch. This will be described later.

By inducing the local stress 28 as described above, stressed regions 29 may be locally formed in the substrate 21 with the global stress 27. The stressed regions 29 are formed under the structures 22. When the local stress 28 and the global stress 27 are the same type, a high density stress is applied to the stressed regions 29.

The stressed regions 29 may include the channels of transistors. The substrate 21 may include a silicon substrate that is formed with the channels of transistors. Accordingly, a stress may be applied to the channels of transistors from a silicon substrate in which a stress is induced. The channels of transistors include major carriers. The major carriers include electrons or holes. The mobility of the major carriers is increased by the stress applied to the stressed regions 29. When a tensile stress is applied to the stressed regions 29, the mobility of electrons is increased. When a compressive stress is applied to the stressed regions 29 the mobility of holes is increased. Accordingly, the driving current of transistors is increased.

Figure 4A:
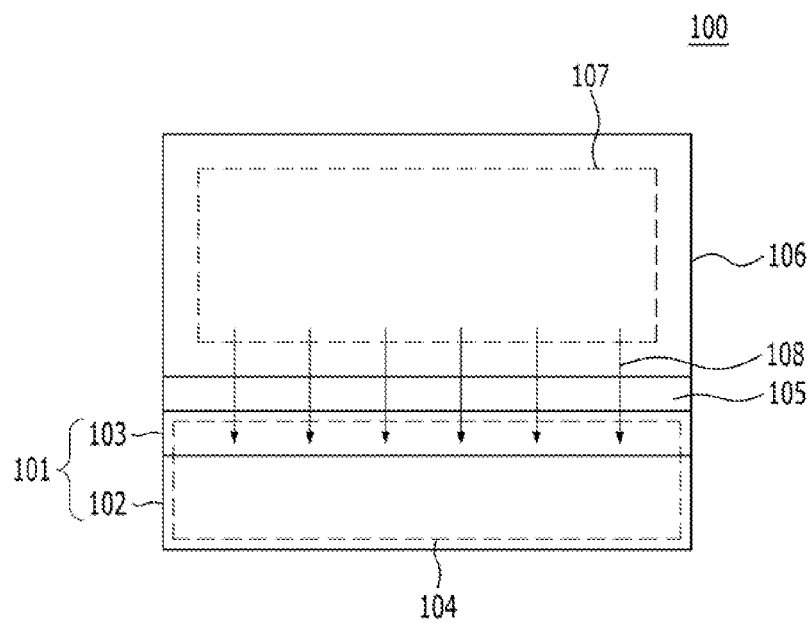
FIG. 4A is a view illustrating a semiconductor structure to which the third embodiment is applied.

FIG. 4A is a view illustrating a semiconductor structure to which the third embodiment is applied.

Referring to FIG. 4A, a semiconductor structure 100 may include a stressed layer 101 and a strained layer 106. An intermediate layer 105 may be additionally formed between the stressed layer 101 and the strained layer 106.

The stressed layer 101 has a global stress 104. The global stress 104 is applied by performing a stress converting process at least one time. The stressed layer 101 may include a first stressed layer 102 and a second stressed layer 103.

The strained layer 106 is a layer in which a strain 107 is generated. A local stress 108 is applied to the second stressed layer 103 by the strain 107. The strained layer 106 is a layer in which the strain 107 is generated due to lattice mismatch. The strained layer 106 includes a strain generating element. That is to say, lattice mismatch occurs by the strain generating element, and the strain 107 is generated by the lattice mismatch.

In this way, the global stress 104 and the local stress 108 are simultaneously applied to the second stressed layer 103.

The stressed layer 101 and the strained layer 106 may include a silicon-containing material. The stressed layer 101 may include a silicon substrate. Accordingly, the second stressed layer 103 is formed on the front surface of the silicon substrate.

The strained layer 106 may include a silicon layer. The strained layer 106 may include a lattice-mismatched silicon layer. The strained layer 106 may include a lattice-mismatched crystalline silicon layer.

The local stress 108 applied to the second stressed layer 103 includes a tensile stress or a compressive stress. The local stress 108 depends on the kind of the strain 107 that is generated in the strained layer 106. For example, a tensile stress is applied by a tensile strain, and a compressive stress is applied by a compressive strain. The global stress 104 of the stressed layer 101 may include a tensile stress. Accordingly, a high tensile stress may be applied to the second stressed layer 103. The high tensile stress includes the local stress 108 applied by the strained layer 106 and the global stress 104.

The global stress 104 is induced by performing the stress converting process at least one time. Therefore, the stressed layer 101 with the global stress 104 is formed.

Figure 4B:
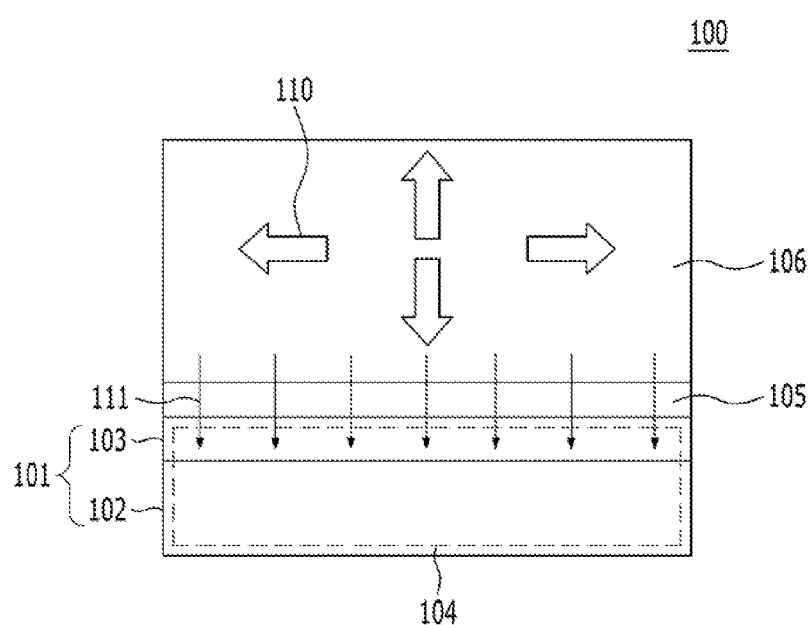
FIG. 4B is a view illustrating a semiconductor structure including a stressed layer to which a high tensile stress is applied due to application of the third embodiment.

FIG. 4B is a view illustrating a semiconductor structure including a stressed layer to which a high tensile stress is applied due to application of the third embodiment.

Referring to FIG. 4B, a tensile strain 110 is generated in a strained layer 106. A local tensile stress 111 is applied to a second stressed layer 103 by the tensile strain 110. In addition, a stressed layer 101 has a global tensile stress 104.

The global tensile stress 104 is applied by performing a stress converting process at least one time.

Accordingly, the local tensile stress 111 and the global tensile stress 104 are applied to the second stressed layer 103.

Figure 4C:
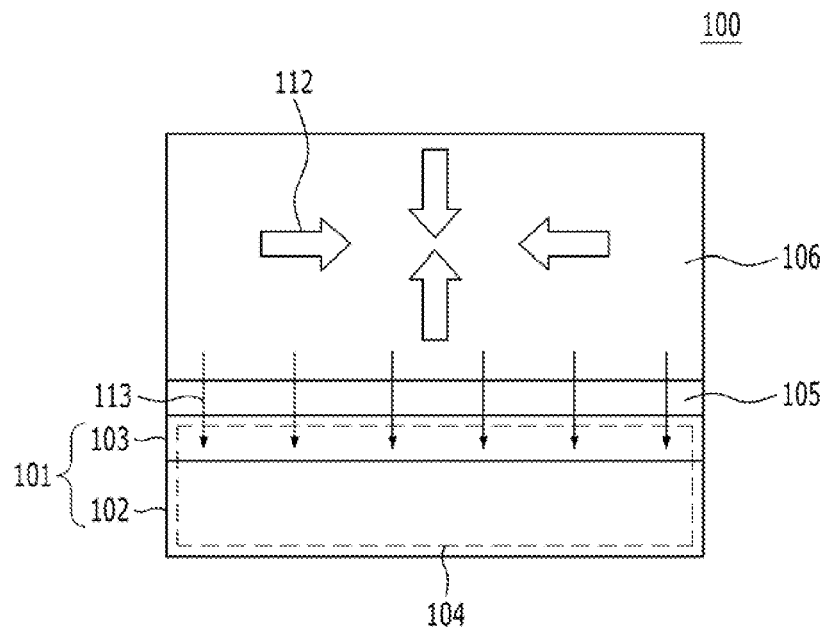
FIG. 4C is a view illustrating a semiconductor structure including a stressed layer to which different types of two stresses are applied due to application of the third embodiment.

FIG. 4C is a view illustrating a semiconductor structure including a stressed layer to which different types of two stresses are applied due to application of the third embodiment.

Referring to FIG. 4C, a compressive strain 112 is generated in a strained layer 106. A local compressive stress 113 is applied to a second stressed layer 103 by the compressive strain 112. In addition, a stressed layer 101, which includes the first stressed layer 102 and the second stressed layer 103, has a global tensile stress 104. The global tensile stress 104 is applied by stress converting that is performed at least one time.

Accordingly the local compressive stress 113 and the global tensile stress 104 are applied to the second stressed layer 103.

Figure 5A:
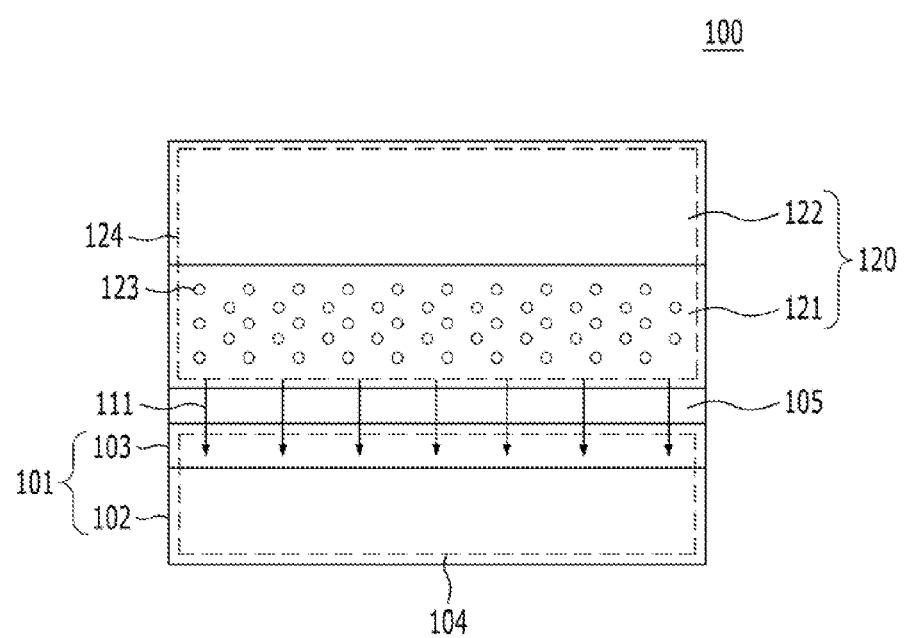
FIG. 5A is a view illustrating an exemplary method for inducing a local tensile stress to a stressed layer.

FIG. 5A is a view illustrating an exemplary method for inducing a local tensile stress to a stressed layer.

Referring to FIG. 5A a strained layer 120 may include a stack of a first silicon layer 121 and a second silicon layer 122. A tensile strain 124 is generated by the lattice mismatch of the first silicon layer 121 and the second silicon layer 122. A strain generating element 123 is doped into the first silicon layer 121 and/or the second silicon layer 122. For example, the strain generating element 123 may be doped into the first silicon layer 121 that is adjacent to a stressed layer 101. The strain generating element 123 may include an element that allows the first silicon layer 121 and/or the second silicon layer 122 to induce a lattice mismatch. The strain generating element 123 may include an element that has an atomic radius larger than that of silicon. The strain generating element 123 may include arsenic (As).

In an exemplary implementation, the first silicon layer 121 is doped with arsenic, and the second silicon layer 122, which is not doped with arsenic, are crystallized by annealing. Thus, the first silicon layer 121, which is doped with arsenic, and the second silicon layer 122, which is not doped with arsenic, are lattice-mismatched with each other. The tensile strain 124 is generated by the lattice mismatch, and a local tensile stress 111 is applied to the stressed layer 101 by the tensile strain 124. The stressed layer 101 has a global tensile stress 104. The global tensile stress 104 is applied by performing a stress converting process at least one time.

Figure 5B:
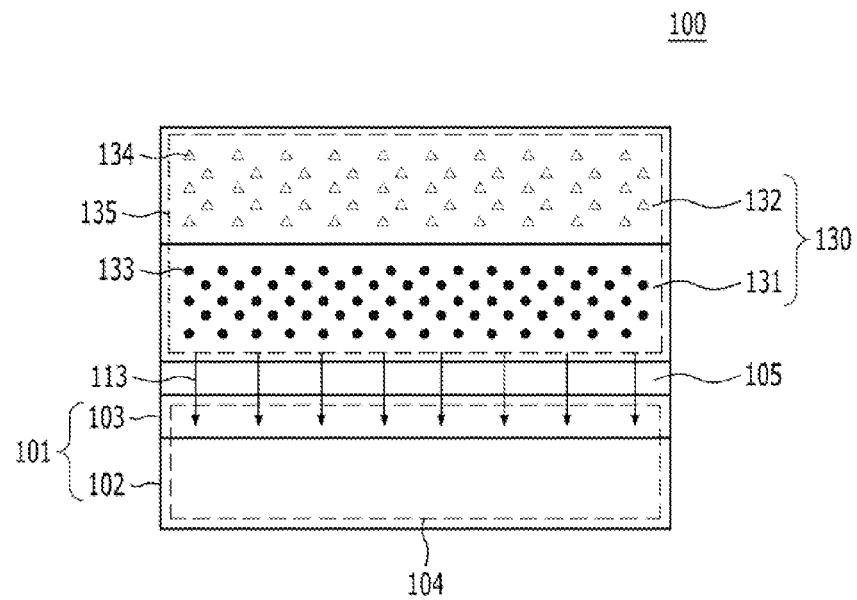
FIG. 5B is a view illustrating an exemplary method for inducing a local compressive stress to a stressed layer.

FIG. 5B is a view illustrating an exemplary method for inducing a local compressive stress to a stressed layer.

Referring to FIG. 5B, a strained layer 130 may include a stack of a first silicon layer 131 and a second silicon layer 132. A compressive strain 135 is generated by the lattice mismatch of the first silicon layer 131 and the second silicon layer 132. Strain generating elements 133 and 134 are respectively doped into the first silicon layer 131 and the second silicon layer 132. The first strain generating element 133 may be doped into the first silicon layer 131. The second strain generating element 134 may be doped into the second silicon layer 132. The first strain generating element 133 and the second strain generating element 134 may include elements that allow the first silicon layer 131 and the second silicon layer 132 to induce lattice mismatch. The first strain generating element 133 and the second strain generating element 134 may include elements that have different atomic radii from the atomic radius of silicon. The first strain generating element 133 may include an element that has an atomic radius smaller than that of silicon. The second strain generating element 134 may include an element that has an atomic radius larger than that of silicon. The first strain generating element 133 may include boron (B). The second strain generating element 134 may include germanium (Ge).

The first silicon layer 131, which is doped with boron, and the second silicon layer 132, which is doped with germanium, are crystallized by annealing. Thus, the first silicon layer 131, which is doped with boron, and the second silicon layer 132, which is doped with germanium, are lattice-mismatched with each other. The compressive strain 135 is generated by the lattice mismatch, and a local compressive stress 113 is applied to a stressed layer 101 by the compressive strain 135. The stressed layer 101 has a global tensile stress 104. The global tensile stress 104 is applied by performing a stress converting process at least one time.

Figure 6:
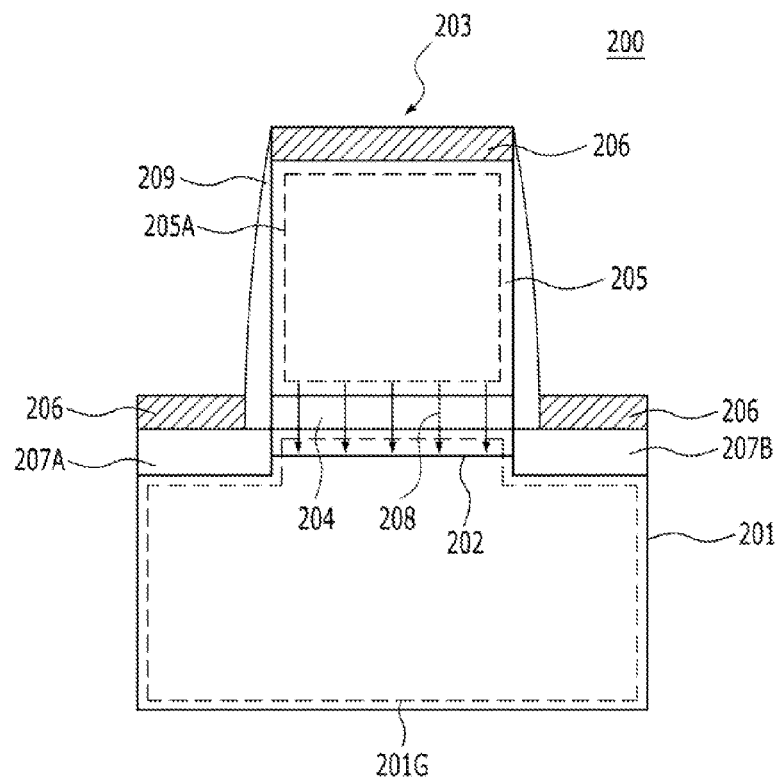
FIG. 6 is a view illustrating a transistor to which the embodiments are applied.

FIG. 6 is a view illustrating a transistor to which the embodiments are applied.

Referring to FIG. 6, a transistor 200 may include a channel 202, which is formed in a stressed substrate 201, and a gate structure 203, which is formed on the channel 202. The channel 202 may be formed between a source region 207A and a drain region 207B. The gate structure 203 may include a gate dielectric layer 204, a gate electrode 205, and a metal silicide layer 206. The metal silicide layer 206 may include a silicide layer that includes nickel (Ni) and platinum (Pt). Gate resistance is reduced by the metal silicide layer 206. The metal silicide layer 206 may also be formed on the source region 207A and the drain region 207B. Spacers 209 may be formed on both sidewalls of the gate structure 203. The gate electrode 205 may include a crystalline silicon layer that is formed by crystallization of an amorphous silicon layer.

A local stress 208 is applied from the gate electrode 205 to the channel 202. A strain generating element is doped into the gate electrode 205. Lattice mismatch occurs in the gate electrode 205 by the strain generating element. A strain 205A is generated in the gate electrode 205 by the strain generating element, and the local stress 208 is applied to the channel 202 by the strain 205A. The strain 205A may be generated according to the above-described embodiments. The strain 205A may include a tensile strain or a compressive strain.

The stressed substrate 201 has a global stress 201G. The global stress 201G is applied by performing a stress converting process at least one time. The global stress 201G and the local stress 208 may include different types of or the same type of stresses. For example, the global stress 201G and the local stress 208 may include tensile stresses. Alternatively, the global stress 201G may include a tensile stress, and the local stress 208 may include a compressive stress.

In FIG. 6, the gate electrode 205 in which the strain 205A is generated is referred to as a strained gate electrode 205. The channel 202 to which the local stress 208 is applied is referred to as a stressed channel 202. For example, as a tensile stress is applied as the local stress 208, a tensile stressed channel is formed. As a compressive stress is applied as the local stress 208, a compressively stressed channel is formed.

Accordingly, the transistor 200 may be also referred to as a stressed channel transistor.

As the local stress 208 by the strain 205A of the gate electrode 205 and the global stress 201G of the stressed substrate 201 are applied to the channel 202, the carrier mobility of the channel 202 may be increased. Carrier mobility is the mobility of major carriers. For example, the electron mobility of an N-channel transistor is increased by a tensile stress. The hole mobility of a P-channel transistor is increased by a compressive stress. If carrier mobility is increased, the driving current of the transistor 200 may be increased, whereby the performance of the transistor 200 may be improved.

Figure 7:
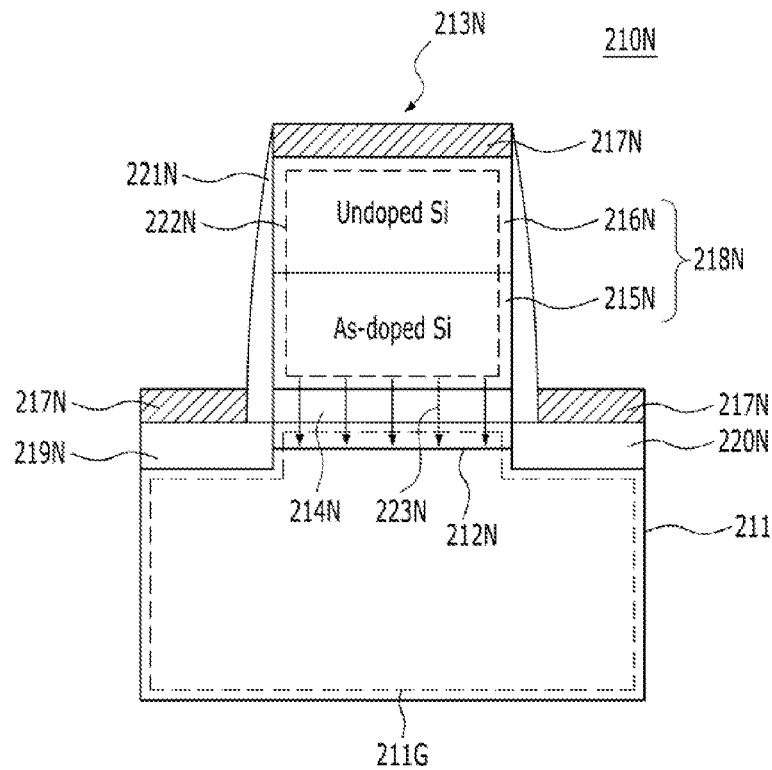
FIG. 7 is a view illustrating an N-channel transistor to which the embodiments are applied.

FIG. 7 is a view illustrating an N-channel transistor to which the embodiments are applied.

Referring to FIG. 7, an N-channel transistor 210N may include an N-channel 212N, which is formed in a stressed substrate 211, and a gate structure 213N, which is formed on the N-channel 212N. The N-channel 212N may be formed between an N-type source region 219N and an N-type drain region 220N. The gate structure 213N may include a gate electrode 218N that applies a local tensile stress 223N to the N-channel 212N. The gate electrode 218N may be doped with a strain generating element. Lattice mismatch occurs in the gate electrode 218N by the strain generating element. A tensile strain 222N is generated in the gate electrode 218N by the lattice mismatch, and the strained gate electrode 218N applies the local tensile stress 223N to the N-channel 212N. The N-channel transistor 210N becomes a stressed N-channel transistor. The stressed substrate 211 has a global tensile stress 211G. The global tensile stress 211G is induced by performing stress converting process at least one time. The stressed substrate 211 applies the global tensile stress 211G to the N-channel 212N.

The gate structure 213N may include a gate dielectric layer 214N, the gate electrode 218N, and a metal silicide layer 217N. The metal silicide layer 217N may include a silicide layer that includes nickel (Ni) and platinum (Pt). Gate resistance is reduced by the metal silicide layer 217N. The metal silicide layer 217N may also be formed on the N-type source region 219N and the N-type drain region 220N. Spacers 221N may be formed on the sidewalls of the gate structure 213N. The gate electrode 218N may include a stack of a first silicon layer 215N and a second silicon layer 216N. The first silicon layer 215N and the second silicon layer 216N may include crystalline silicon layers. A strain generating element may be doped into the first silicon layer 215N. A strain generating element may not doped into the second silicon layer 216N. Arsenic (As) may be doped into the first silicon layer 215N. Arsenic is an element that has an atomic radius larger than that of silicon. The first silicon layer 215N and the second silicon layer 216N are lattice-mismatched with each other by the first silicon layer 215N that is doped with arsenic. The tensile strain 222N is generated in the gate electrode 218N by the lattice mismatch. The tensile strain 222N applies the local tensile stress 223N to the N-channel 212N.

As the local tensile stress 223N and the global tensile stress 211G are applied to the N-channel 212N, the electron mobility of the N-channel 212N may be increased. In this case, the electron mobility may be further increased compared to the electron mobility when the local tensile stress 223N or the global tensile stress 211G is solely applied to the N-channel 212N.

If the electron mobility is increased, the driving current of the N-channel transistor 210N may be increased, whereby the performance of the N-channel transistor 210N may be improved.

Figure 8:
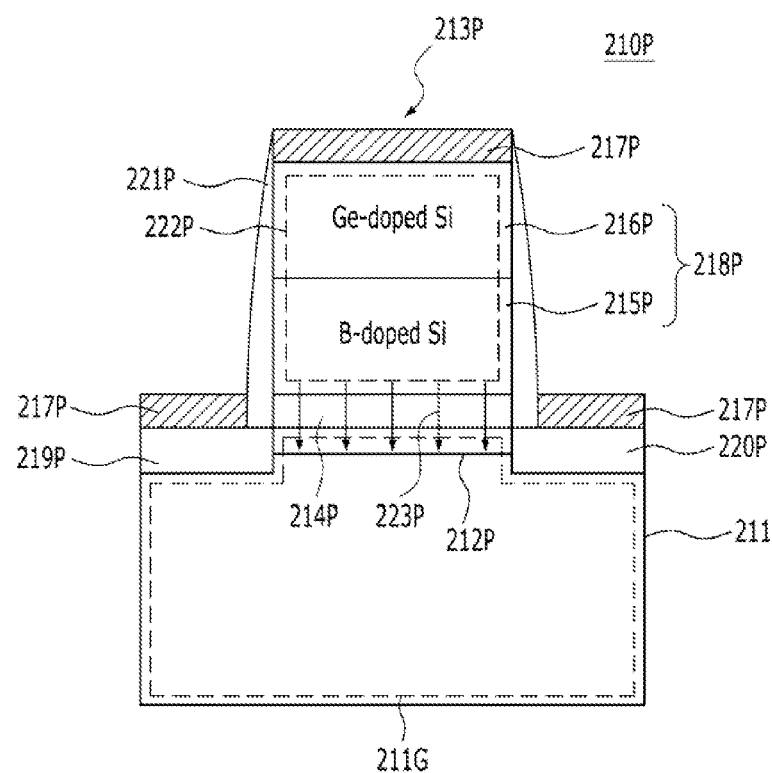
FIG. 8 is a view illustrating a P-channel transistor to which the embodiments are applied.

FIG. 8 is a view illustrating a P-channel transistor to which the embodiments are applied.

Referring to FIG. 8, a P-channel transistor 210P may include a P-channel 212P, which is formed in a stressed substrate 211, and a gate structure 213P, which is formed on the P-channel 212P. The P-channel 212P may be formed between a P-type source region 219P and a P-type drain region 220P. The gate structure 213P may include a gate electrode 218P that applies a local compressive stress 223P to the P-channel 212P. The gate electrode 218P may be doped with a strain generating element. Lattice mismatch occurs in the gate electrode 218P by the strain generating element. A compressive strain 222P is generated in the gate electrode 218P by the lattice mismatch, and the strained gate electrode 218P applies the local compressive stress 223P to the P-channel 212P. The P-channel transistor 210P becomes a stressed P-channel transistor. The stressed substrate 211 applies a global tensile stress 211G to the P-channel 212P.

The gate structure 213P may include a gate dielectric layer 214P, the gate electrode 218P, and a metal silicide layer 217P. The metal silicide layer 217P may include a silicide layer that includes nickel (Ni) and platinum (Pt). Gate resistance is reduced by the metal silicide layer 217P. The metal silicide layer 217P may also be formed on the P-type source region 219P and the P-type drain region 220P.

Spacers 221P may be formed on the sidewalls of the gate structure 213P. The gate electrode 218P may include a stack of a first silicon layer 215P and a second silicon layer 216P. The first silicon layer 215P and the second silicon layer 216P may include crystalline silicon layers. Boron (B) may be doped into the first silicon layer 215P. Boron is an element that has an atomic radius smaller than that of silicon. Germanium (Ge) may be doped into the second silicon layer 216P. Germanium is an element that has an atomic radius larger than that of silicon.

The first silicon layer 215P, which is doped with boron, and the second silicon layer 216P, which is doped with germanium, are lattice-mismatched with each other. The compressive strain 222P is generated in the gate electrode 218P by the lattice mismatch. The compressive strain 222P applies the local compressive stress 223P to the P-channel 212P.

As the local compressive stress 223P is applied to the P-channel 212P, the hole mobility of the P-channel 212P may be increased. If the hole mobility is increased, the driving current of the P-channel transistor 210P may be increased, whereby the performance of the P-channel transistor 210P may be improved, Meanwhile, the global tensile stress 211G applied to the P-channel 212P does not exert any influence on the hole mobility.

The stressed channel transistor according to FIGS. 6 to 8 may include a field effect transistor (FET). The field effect transistor may be, for example, a MOSFET (metal oxide semiconductor FET) or a MISFET (metal insulator semiconductor FET). The N-channel transistor 210N shown in FIG. 7 may be, for example, an NMOSFET. The P-channel transistor 210P shown in FIG. 8 may be, for example, a PMOSFET.

Further exemplary implementations according to FIGS. 6 to 8 may be applied to a planar transistor. The planar transistor is a transistor that has a horizontal channel.

The exemplary implementations according to FIGS. 6 to 8 may be applied to a non-planar transistor. The non-planar transistor is a transistor that has a channel having a channel length longer than that of a horizontal channel. The non-planar transistor may include, for example, a fin-type transistor (FinFET), a buried gate type transistor, a vertical channel transistor, and so forth.

Figure 9:
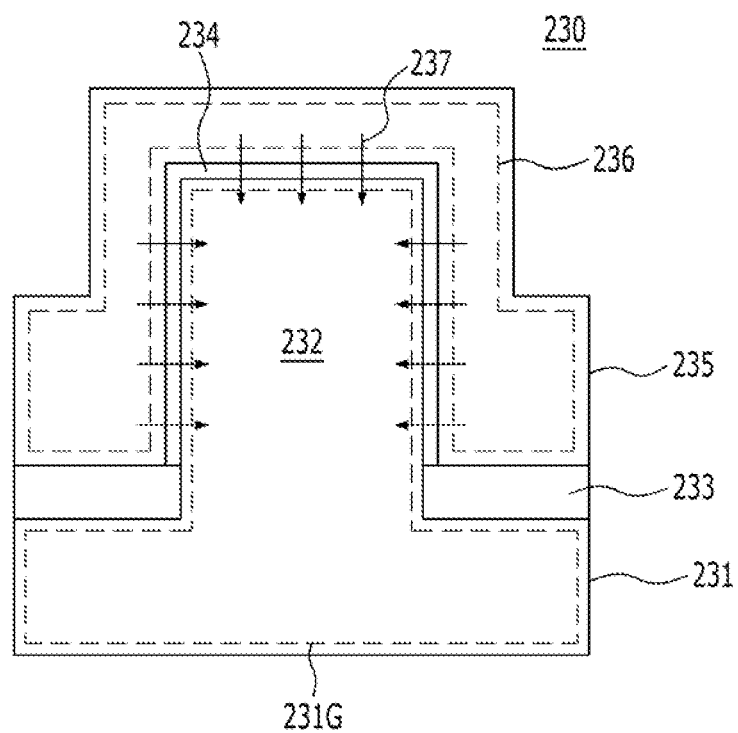
FIG. 9 is a view illustrating a fin-type transistor to which the embodiments are applied.

FIG. 9 is a view illustrating a fin-type transistor to which the embodiments are applied.

Referring to FIG. 9, the fin-type transistor 230 may include a fin-type channel 232 that is formed on a stressed substrate 231, and a gate electrode 235. A gate dielectric layer 234 may be formed on the fin-type channel 232. The bottom portion of the fin-type channel 232 may be buried in a dielectric layer 233.

The gate electrode 235 applies a local stress 237 to the fin-type channel 232. The gate electrode 235 may be doped with a strain generating element. Lattice mismatch occurs in the gate electrode 235 by the strain generating element. A strain 236 is generated in the gate electrode 235 by the lattice mismatch, and the strained gate electrode 235 applies the local stress 237 to the fin-type channel 232.

For a method for generating the strain 236 in the gate electrode 235, reference may be made to the above-described embodiments.

A global stress 231G is induced in the stressed substrate 231 by performing a stress converting process at least one time. The global stress 231G is applied to the fin-type channel 232.

Figure 10:
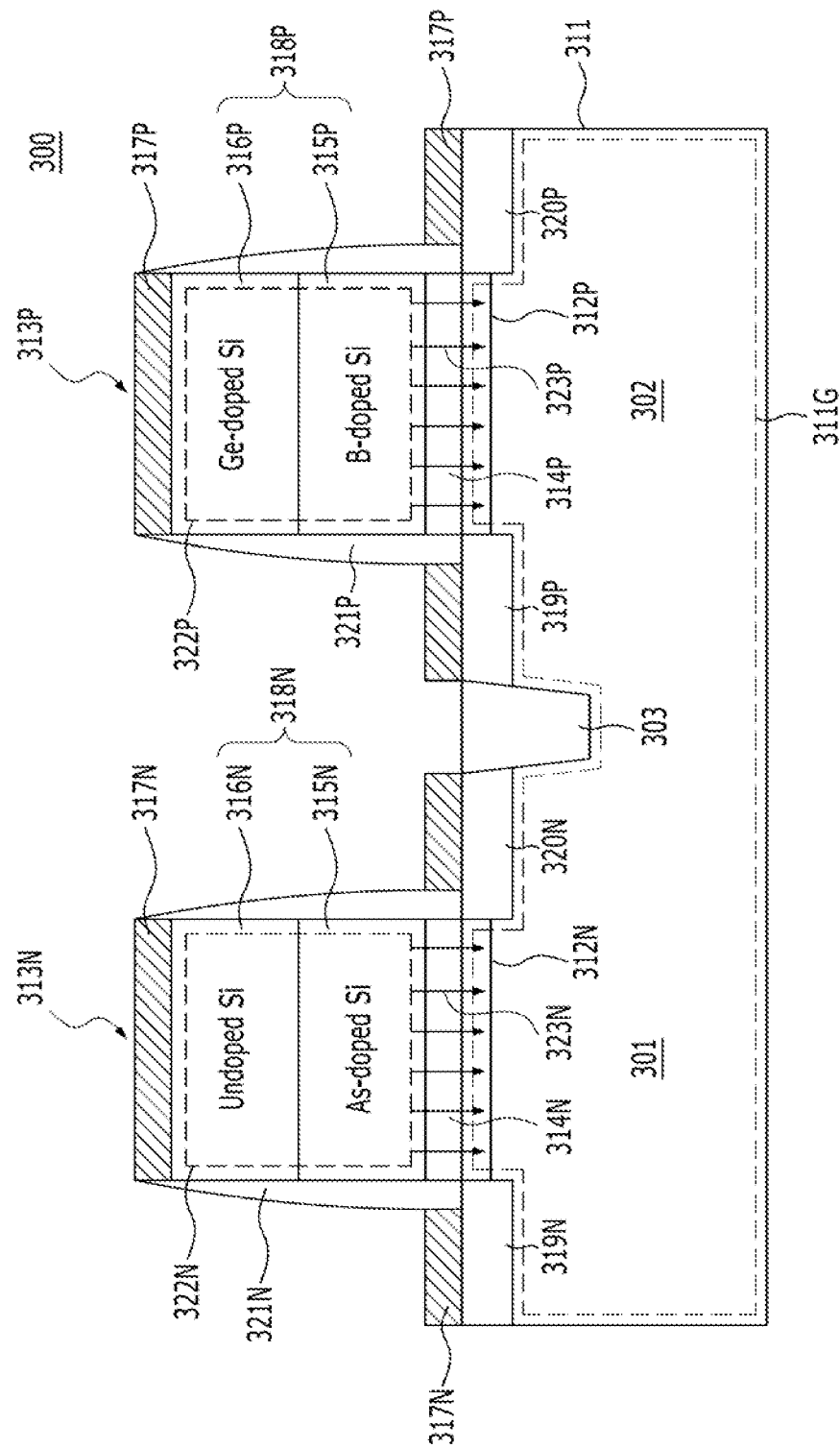
FIG. 10 is a view illustrating an exemplary semiconductor device to which the embodiments are applied.

FIG. 10 is a view illustrating an exemplary semiconductor device to which the embodiments are applied. FIG. 10 illustrates a semiconductor device that includes a plurality of transistors. The semiconductor device shown in FIG. 10 may include a CMOSFET or a CMISFET.

Referring to FIG. 10, a semiconductor device 300 includes a plurality of transistors. The transistors may include a first transistor 301 and a second transistor 302. The first transistor 301 and the second transistor 302 may be isolated by an isolation layer 303. A stressed substrate 311 on which the first transistor 301 and the second transistor 2 are formed has a global tensile stress 311G.

The first transistor 301 may include a first stressed channel 312N, which is formed in the stressed substrate 311, and a first gate structure 313N, which is formed on the first stressed channel 312N. The first stressed channel 312N may be formed between a first source region 319N and a first drain region 320N. The first gate structure 313N may include a first strained gate electrode 318N that applies a local tensile stress 323N to the first stressed channel 312N. The first gate structure 313N may include a first gate dielectric layer 314N, the first strained gate electrode 318N, and a first metal silicide layer 317N. First spacers 321N may be formed on both sidewalls of the first gate structure 313N. The first strained gate electrode 318N may include a stack of a first silicon layer 315N and a second silicon layer 316N. The first silicon layer 315N and the second silicon layer 316N may include crystalline silicon layers. Arsenic (As) may be doped into the first silicon layer 315N. Arsenic may not be doped into the second silicon layer 316N. Arsenic is an element that has an atomic radius larger than that of silicon. The first silicon layer 315N and the second silicon layer 316N are lattice-mismatched with each other by the first silicon layer 315N that is doped with arsenic. A tensile strain 322N is generated in the first strained gate electrode 318N by the lattice mismatch. The tensile strain 322N applies the local tensile stress 323N to the first stressed channel 312N. The first stressed channel 312N is a tensile stressed channel.

The second transistor 302 may include a second stressed channel 312P, which is formed in the stressed substrate 311, and a second gate structure 313P, which is formed on the second stressed channel 312P. The second stressed channel 312P may be formed between a second source region 319P and a second drain region 320P. The second gate structure 313P may include a second strained gate electrode 318P that applies a local compressive stress 323P to the second stressed channel 312P. The second gate structure 313P may include a second gate dielectric layer 314P, the second strained gate electrode 318P, and a second metal silicide layer 317P. Second spacers 321P may be formed on both sidewalls of the second gate structure 313P. The second strained gate electrode 318P may include the stack of a third silicon layer 315P and a fourth silicon layer 316P. The third silicon layer 315P and the fourth silicon layer 316P may include crystalline silicon layers. Boron (B) may be doped into the third silicon layer 315P. Germanium (Ge) may be doped into the fourth silicon layer 316P. Boron is an element that has an atomic radius smaller than that of silicon. Germanium is an element that has an atomic radius larger than that of silicon. The third silicon layer 315P doped with boron and the fourth silicon layer 316P doped with germanium are lattice-mismatched with each other. A compressive strain 322P is generated in the second strained gate electrode 318P by the lattice mismatch. The compressive strain 322P applies the local compressive stress 323P to the second stressed channel 312P. The second stressed channel 312P is a compressively stressed channel.

According to FIG. 10, the semiconductor device 300 may include the first strained gate electrode 318N and the second strained gate electrode 318P in which different types of strains are generated. Further, the semiconductor device 300 has the first stressed channel 312N and the second stressed channel 312P, which have different types of stresses. The first stressed channel 312N and the second stressed channel 312P are formed in the stressed substrate 311.

In this way, the semiconductor device 300 may include a plurality of transistors having different types of strained gate electrodes and different types of stressed channels. The performance of the first transistor 301 is improved by inducing the local tensile stress 323N and the global tensile stress 311G to the first stressed channel 312N. The performance of the second transistor 302 is improved by inducing the local compressive stress 323P to the second stressed channel 312P.

Accordingly, in the exemplary semiconductor device 300, which as a plurality of transistors in which performance is improved, a driving speed may be increased and power consumption may be reduced.

FIGS. 11A to 11K are views explaining an exemplary method for fabricating the semiconductor device shown in FIG. 10.

Figure 11A:
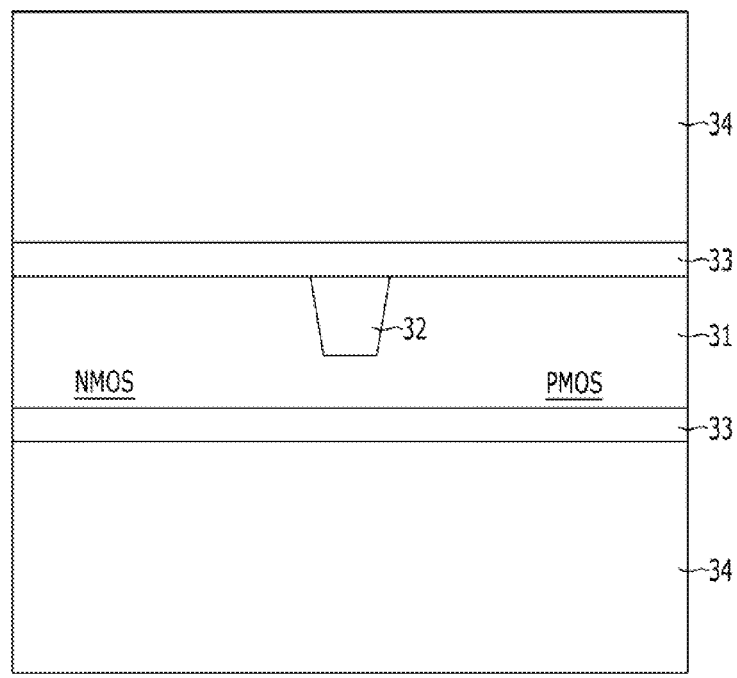
FIGS. 11A to 11K are views explaining an exemplary method for fabricating the semiconductor device shown in FIG. 10.

As shown in FIG. 11A an isolation layer 32 is formed in a substrate 31. The substrate 31 may include silicon, germanium or silicon-germanium, while not being limited to such.

The isolation layer 32 may be formed by an STI (shallow trench isolation) process. For instance, after forming a pad layer (not shown) on the substrate 31, the pad layer and the substrate 31 are etched using an isolation mask (not shown). Thus, a trench is defined. After defining the trench, the isolation layer 32 may be formed by filling the trench with a dielectric material. For example, the isolation layer 32 may be formed of a wall oxide layer, a liner layer and a fill dielectric layer that are sequentially formed in the trench. The liner layer may be formed by stacking a silicon nitride layer and a silicon oxide layer. The silicon nitride layer may include $Si_3N_4$, and the silicon oxide layer may include $SiO_2$. The fill dielectric layer may include a spin-on dielectric (SOD). In another embodiment, the isolation layer 32 may use a silicon nitride layer as the fill dielectric layer.

A first region NMOS and a second region PMOS are isolated by the isolation layer 32. The first region NMOS is a region where an NMOSFET is to be formed. The second region PMOS is a region where a PMOSFET is to be formed. While not shown, wells may be formed in the substrate 31 according to a well forming process that is generally known in the art. A P-type well may be formed in the substrate 31 in the first region NMOS. An N-type well may be formed in the substrate 31 in the second region PMOS.

A gate dielectric layer 33 is formed on the substrate 31. The gate dielectric layer 33 may include silicon oxide, silicon nitride or a high-k material. The high-k material is a material that has a higher dielectric constant than that of silicon oxide. The high-k material may include a metal-containing material, such as a metal oxide, a metal silicate, or a metal silicate nitride. The metal oxide may include, for example, hafnium oxide ($HfO_2$), aluminum oxide ($Al_2O_3$), lanthanum oxide ($La_2O_3$) and zirconium oxide ($ZrO_2$) or a combination thereof. The metal silicate may include, for example, hafnium silicate (HfSiO), zirconium silicate (ZrSiOx), or a combination thereof. The metal silicate nitride is a material that may be formed by mixing nitrogen to a metal silicate. The metal silicate nitride may include, for example, hafnium silicate nitride (HfSiON). If the gate dielectric layer 33 is formed using a metal silicate nitride, then a dielectric constant may be increased and crystallization may be suppressed in a subsequent thermal process. A process for forming the gate dielectric layer 33 may include a deposition technology that is appropriate for a material to be deposited. For example, chemical vapor deposition (CVD), low-pressure CVD (LPCVD), plasma-enhanced CVD (PECVD), metal-organic CVD (MOCVD), atomic layer deposition (ALD), plasma enhanced ALD (PEALD), and so forth may be used. For uniformly forming a layer, plasma enhanced ALD (PEALD) may be used. When a high-k material layer is applied as the gate dielectric layer 33, an interfacial layer may be additionally formed under the high-k material layer.

A silicon layer 34 is formed on the gate dielectric layer 33. The silicon layer 34 is a material that is to be formed as gate electrodes. The silicon layer 34 may include an undoped silicon layer that is not doped with an impurity, such as an undoped amorphous silicon layer.

The gate dielectric layer 33 and the silicon layer 34 may be deposited on both front and back surfaces of the substrate 31. In order to perform deposition on the front and back surfaces of the substrate 31 in this way, furnace equipment may be used.

Figure 11B:
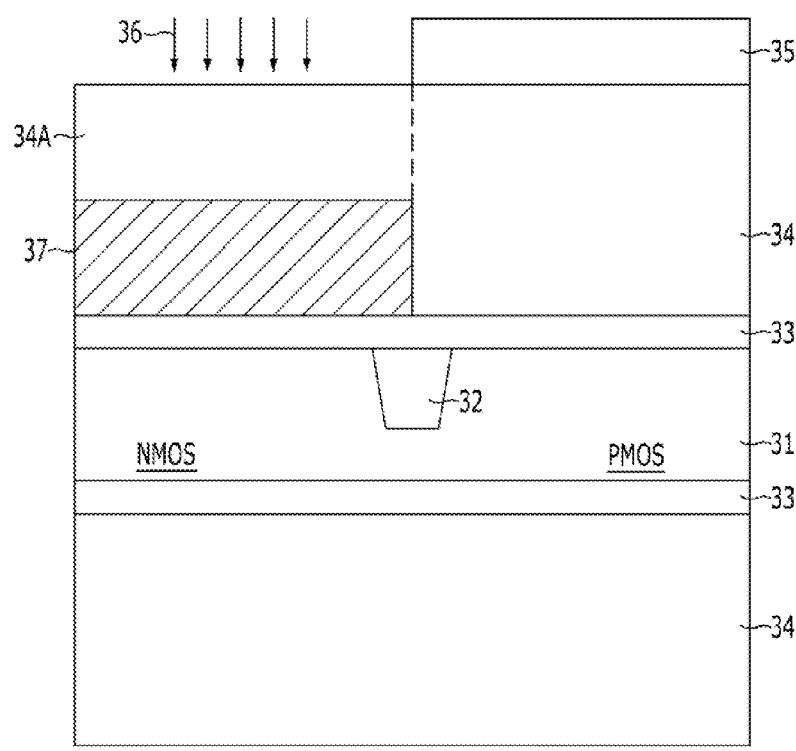

As shown in FIG. 11B, a first doping process 36 is performed. The first doping process 36 is performed using a first mask layer 35. The first mask layer 35 covers any one region of the first region NMOS and the second region PMOS. For example, the first mask layer 35 may cover the second region PMOS.

Arsenic (As) iso doped by the first doping process 36. Arsenic is locally doped into the silicon layer 34 of the first region NMOS to form a first doped silicon layer 37. The first doped silicon layer 37 may be formed adjacent to the gate dielectric layer 33. Accordingly, a first stack of the first doped silicon layer 37 and an undoped silicon layer 34A is formed on the substrate 31 of the first region NMOS. The first doped silicon layer 37 may be an arsenic-doped amorphous silicon layer. The undoped silicon layer 34A is not doped with arsenic.

Figure 11C:
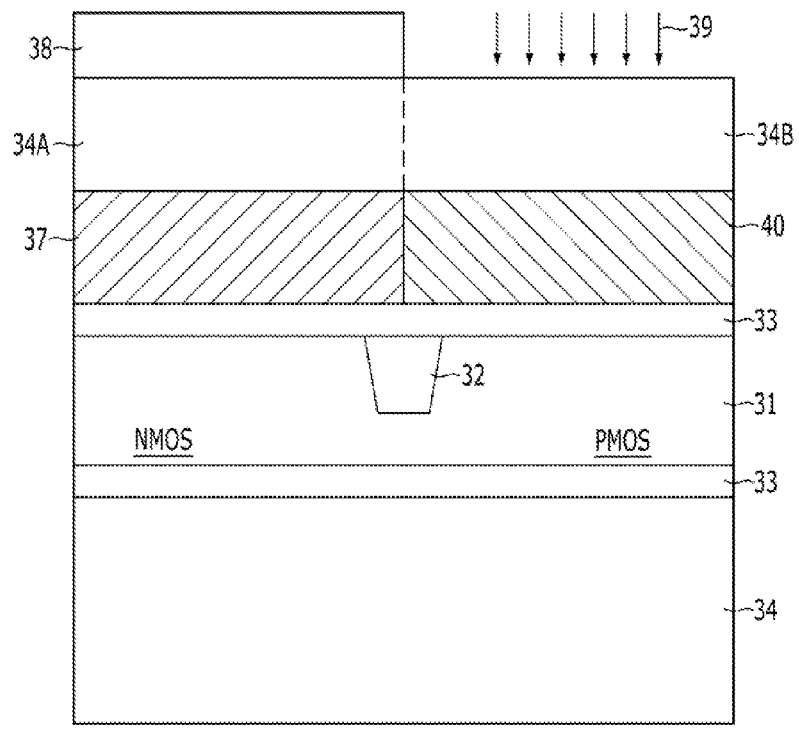

As shown in FIG. 11C, after the first mask layer 35 is stripped, a second doping process 39 is performed. The second doping process 39 is performed using a second mask layer 38. The second mask layer 38 covers the first region NMOS and exposes the silicon layer 34 of the second region PMOS.

Boron is locally doped by the second doping process 39 into the silicon layer 34 of the second region PMOS to form a second doped silicon layer 40. The second doped silicon layer 40 may be formed adjacent to the gate dielectric layer 33. Accordingly, the stack of the second doped silicon layer 40 and an undoped silicon layer 34B is formed on the substrate 31 of the second region PMOS. The second doped silicon layer 40 may be a boron-doped amorphous silicon layer. The undoped silicon layer 34B is not doped with boron.

Figure 11D:
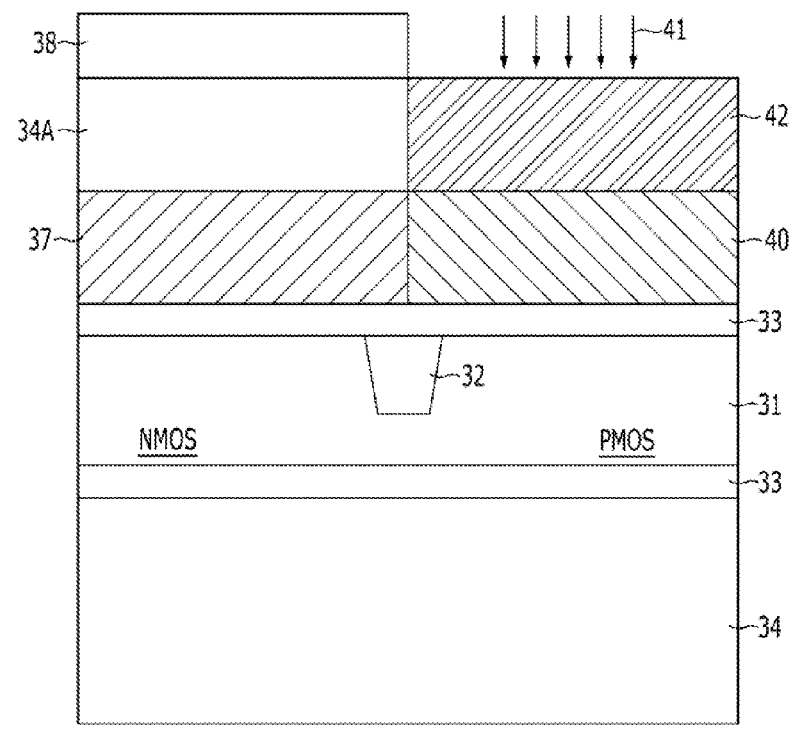

As shown in FIG. 11D, a third doping process 41 is performed. The third doping process 41 is performed using the second mask layer 38. Germanium is locally doped by the third doping process 41 into the undoped silicon layer 34B of the second region PMOS to form a third doped silicon layer 42. The third doped silicon layer 42 may be a germanium-doped amorphous silicon layer. The third doped silicon layer 42 is positioned on the second doped silicon layer 40. Accordingly, a second stack of the second doped silicon layer 40 and the third doped silicon layer 42 is formed on the substrate 31 of the second region PMOS. The second doped silicon layer 40 and the third doped silicon layer 42 are formed in such a manner that boron and germanium are not mixed with each other. Due to this fact, lattice-mismatching layers may be easily formed by subsequent annealing. When boron may be doped after doping germanium, it is difficult to generate a compressive strain. Also, in the case where germanium and boron are mixed, it is difficult to generate a compressive strain.

Figure 11E:
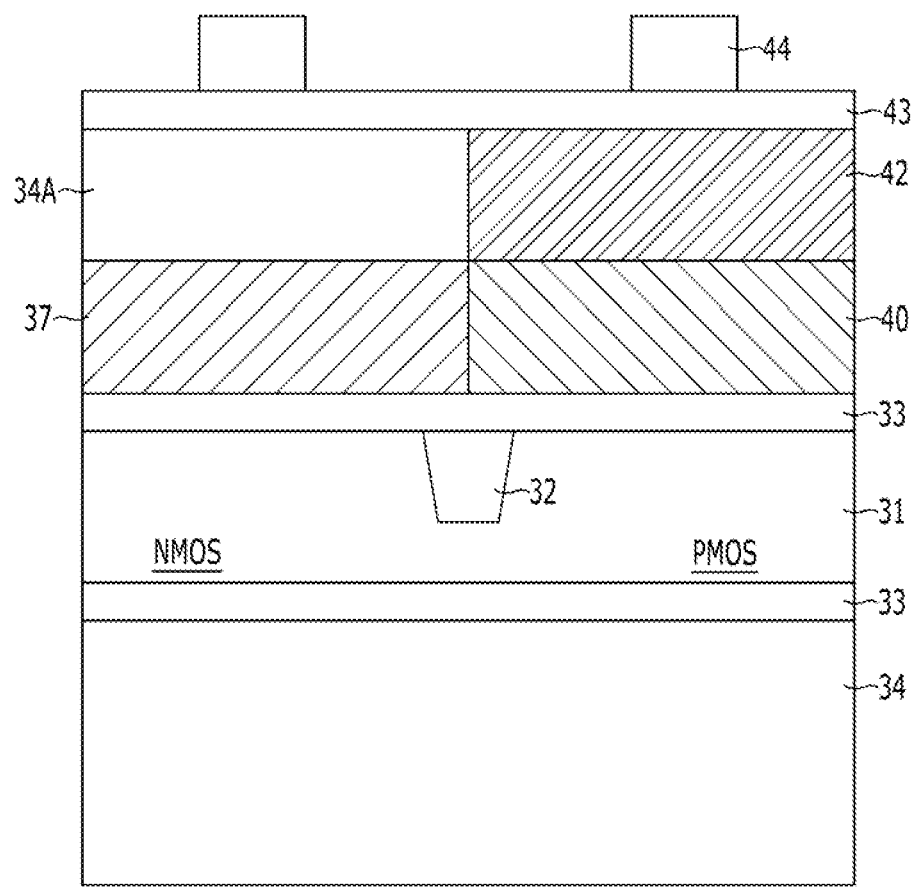

As shown in FIG. 11E, after the second mask layer 38 is stripped, a hard mask layer 43 is formed. The hard mask layer 43 may include silicon nitride or silicon oxide.

A third mask layer 44 is formed on the hard mask layer 43. The third mask layer 44 may serve as an etch mask for gate patterning.

Figure 11F:
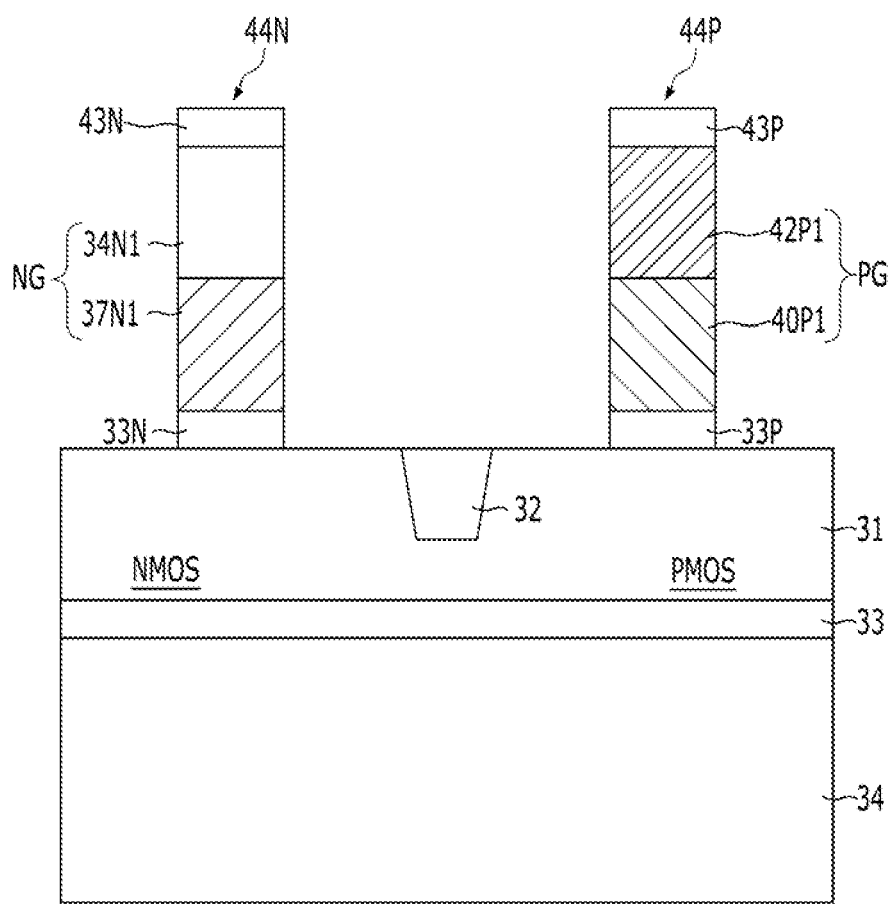

As shown in FIG. 11F, gate patterning is performed. For example, the hard mask layer 43, the first stack of the first doped silicon layer 37 and the undoped silicon layer 34A, the second stack of the second doped silicon layer 40 and the undoped silicon layer 34B, and the gate dielectric layer 33 are etched.

Thus, a first gate structure 44N and a second gate structure 44P are formed. The first gate structure 44N is formed on the substrate 31 of the first region NMOS. The second gate structure 44P is formed on the substrate 31 of the second region PMOS.

The first gate structure 44N may include a first gate dielectric layer 33N, a first gate electrode NG, and a first hard mask layer 43N. The second gate structure 44P may include a second gate dielectric layer 33P a second gate electrode PG, and a second hard mask layer 43P. The first gate dielectric layer 33N and the second gate dielectric layer 33P may be formed by etching the gate dielectric layer 33. The first gate electrode NG may be formed by etching the first doped silicon layer 37 and the undoped silicon layer 34A. The second gate electrode PG may be formed by etching the second doped silicon layer 40 and the third doped silicon layer 42. The first hard mask layer 43N and the second hard mask layer 43P may be formed by etching the hard mask layer 43.

The first gate electrode NG may include a first doped silicon layer 37N1, which is doped with arsenic, and an undoped silicon layer 34N1, which is not doped with arsenic. The first doped silicon layer 37N1 and the undoped silicon layer 34N1 may be amorphous silicon layers.

The second gate electrode PG may include a second doped silicon layer 40P1, which is doped with boron, and a third doped silicon layer 42P1, which is doped with germanium. The second doped silicon layer 40P1 and the third doped silicon layer 42P1 may be amorphous silicon layers.

Subsequently to the gate patterning process, well-known processes may be performed. For example, processes for forming spacers and sources/drains may be performed.

Figure 11G:
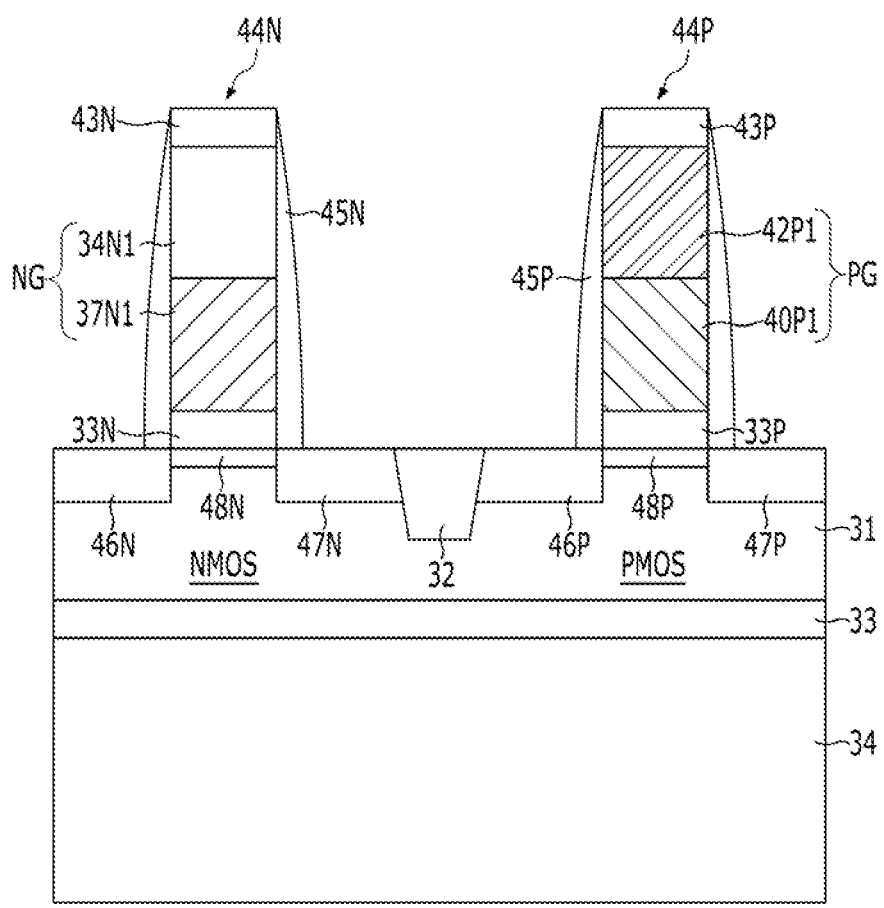

As shown in FIG. 11G, first spacers 45N and second spacers 45P are formed. The first spacers 45N may be formed on both sidewalls of the first gate structure 44I. The second spacers 45P may be formed on both sidewalls of the second gate structure 44P. The first spacers 45N and the second spacers 45P may include silicon nitride. In another embodiment, the first spacers 45N and the second spacers 45P may have a multi-layered spacer structure that includes a silicon oxide layer and a silicon nitride layer.

By doping impurities, a first source region 46N, a first drain region 47N, a second source region 46P and a second drain region 47P are formed in the substrate 31. The first source region 46N and the first drain region 47N are formed in the substrate 31 of the first region NMOS. The first source region 46N and the first drain region 47N may be doped with an N-type impurity. The second source region 46P and the second drain region 47P are formed in the substrate 31 of the second region PMOS. The second source region 46P and the second drain region 47P may be doped with a P-type impurity. A first channel 48N may be formed between the first source region 46N and the first drain region 47N. A second channel 48P may be formed between the second source region 46P and the second drain region 47P. The first gate structure 44N may be positioned on the first channel 48N. The second gate structure 44P may be positioned on the second channel 48P. The first source region 46N, the first drain region 47N, the second source region 46P and the second drain region 47P may be a structure that further includes LDDs (lightly doped sources/drains) or SDEs (source/drain extensions). The LDDs or the SDEs may be formed by doping impurities into the substrate 31 before forming the first spacers 45N and the second spacers 45P.

Figure 11H:
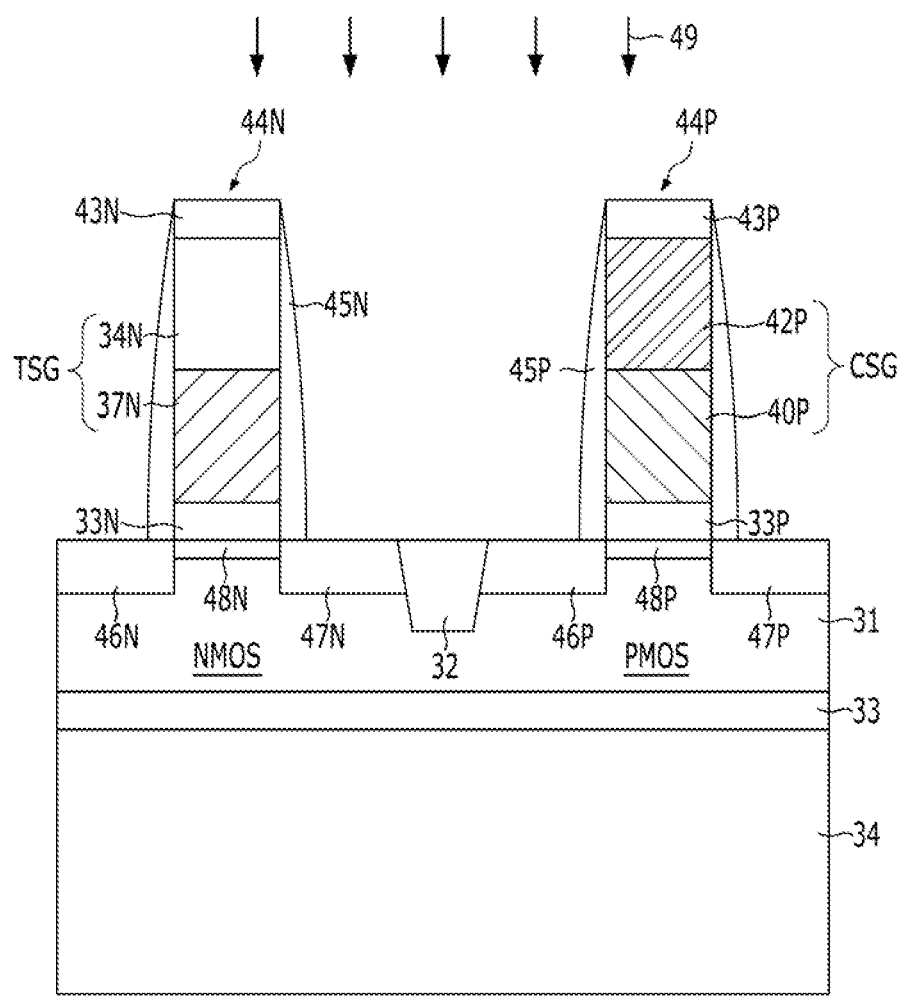

As shown in FIG. 11H, annealing process 49 is performed. By the annealing process 49, the impurities doped into the first source region 46N, the first drain region 47N, the second source region 45P, and the second drain region 47P are activated.

By such annealing process 49, strains are generated in the first gate electrode NG and the second gate electrode PG. Accordingly, the first gate electrode NG is converted into a first strained gate electrode TSG. The second gate electrode PG is converted into a second strained gate electrode CSG. The strains are generated due to lattice mismatch. Lattice mismatch occurs in the first strained gate electrode TSG and the second strained gate electrode CSG, respectively.

By the annealing process 49, the first doped silicon layer 37N1, which is doped with arsenic, and the undoped silicon layer 34N1 are lattice-mismatched with each other. In other words, as the first doped silicon layer 37N1 and the undoped silicon layer 34N1 are crystallized by the annealing process 49, lattice mismatch occurs based on a difference between the atomic radii of silicon and arsenic. The first strained gate electrode TSG may include a crystalline first doped silicon layer 37N and a crystalline undoped silicon layer 34N, The crystalline first doped silicon layer 37N and the crystalline undoped silicon layer 34N form a first lattice-mismatched crystalline silicon layer. A tensile strain is generated by the first lattice-mismatched crystalline silicon layer. Accordingly, the first strained gate electrode TSG includes a tensile strained gate electrode TSG.

By the annealing process 49, the second doped silicon layer 40P1, which is doped with boron, and the third doped silicon layer 42P1, which is doped with germanium, are lattice-mismatched with each other. In other words, as the second doped silicon layer 40P1, which is doped with boron, and the third doped silicon layer 42P1, which is doped with germanium, are crystallized by the annealing process 49, lattice mismatch occurs based on a difference between the atomic radii of boron and germanium. The second strained gate electrode CSG may include a crystalline second doped silicon layer 40P and a crystalline third doped silicon layer 42P. The crystalline second doped silicon layer 40P and the crystalline third doped silicon layer 42P form a second lattice-mismatched crystalline silicon layer. A compressive strain is generated by the second lattice-mismatched crystalline silicon layer. Accordingly, the second strained gate electrode CSG includes a compressive strained gate electrode CSG.

A local tensile stress is applied to the first channel 48N by the first strained gate electrode TSG. A local compressive stress is applied to the second channel 48P by the second strained gate electrode CSG. The first channel 48N becomes a tensile stressed channel, and the second channel 48P becomes a compressive stressed channel.

The annealing process 49 for forming the first strained gate electrode TSG and the second strained gate electrode CSG may be performed by another annealing that is subsequently performed. For example, annealing for stress converting or annealing for forming a silicide layer may be performed.

Figure 11I:
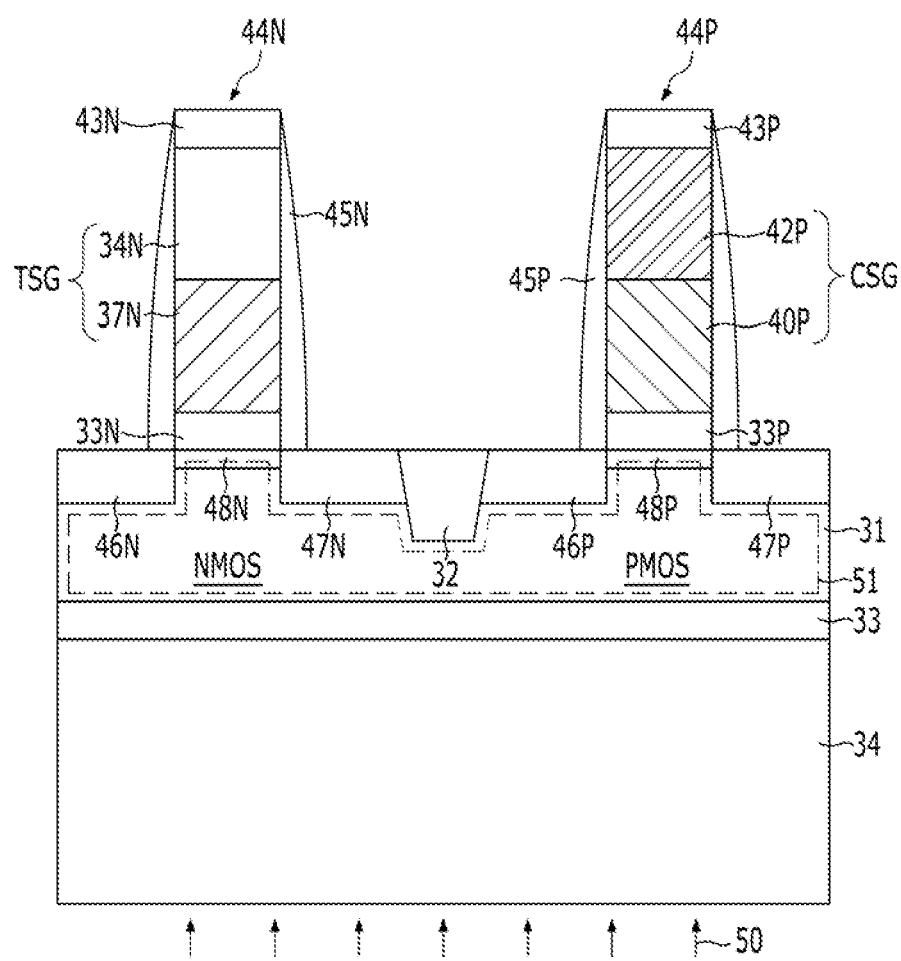
Figure 11J:
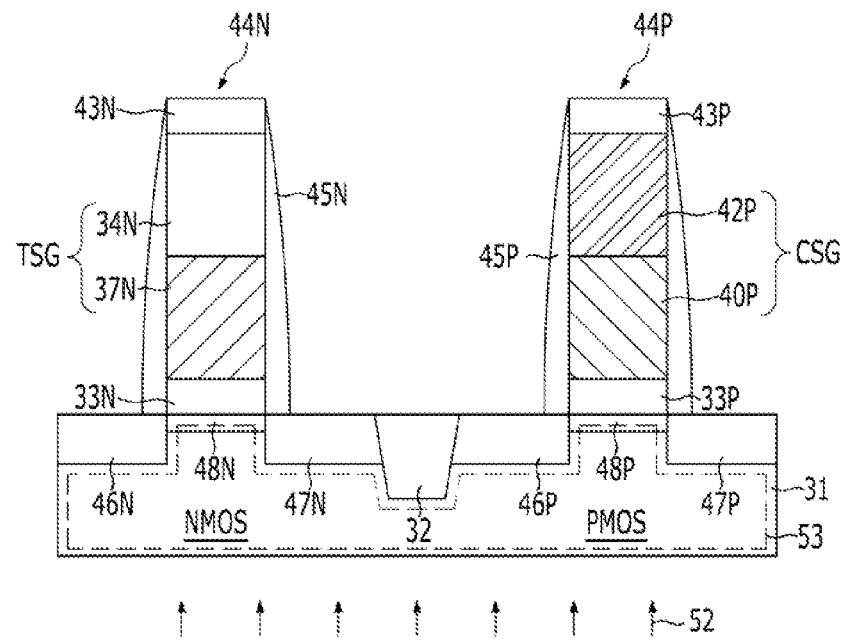

As shown in FIG. 11I, a first stress converting process 50 is performed for the substrate 31. By the first stress converting process 50, a global compressive stress 51 is applied to the substrate 31. As shown in FIG. 11J, a second stress converting process 52 is performed for the substrate 31. By the second stress converting process 52, the global compressive stress 51 is converted into a global tensile stress 53. Accordingly, the global tensile stress 53 is applied to the substrate 31.

For the first stress converting process 50 and the second stress converting process 52, reference may be made to the stress engineering methods according to the first and second embodiments. For instance, the first stress converting process 50 may be performed by implanting phosphorus into the silicon layer 34 on the back surface of the substrate 31. Thereafter, after stripping the silicon layer 34 doped with phosphorus from the back surface of the substrate 31, annealing for the second stress converting 52 is performed.

Figure 11K:
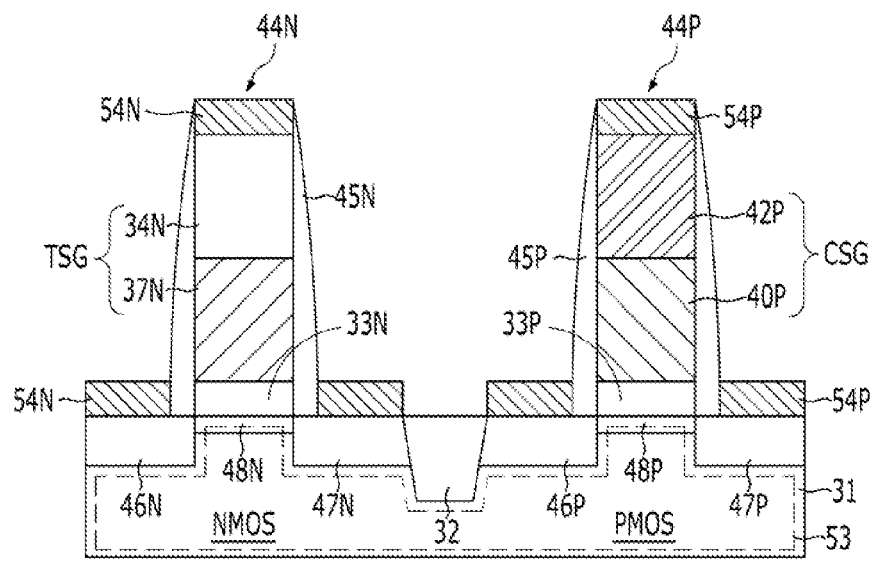

As shown in FIG. 11K, the first hard mask layer 43N and the second hard mask layer 43P are stripped. Thus, the surfaces of the first strained gate electrode TSG and the second strained gate electrode CSG are exposed.

A first metal silicide layer 54N and a second metal silicide layer 54P may be formed on the first strained gate electrode TSG and the second strained gate electrode CSG, respectively. The first metal silicide layer 54N and the second metal silicide layer 54P may include a silicide layer that includes nickel (Ni) and platinum (Pt). By the first metal silicide layer 54N and the second metal silicide layer 54P, a gate resistance may be reduced. An exemplary method of forming the first metal silicide layer 54N and the second metal silicide layer 54P is as follows. First, after depositing a Ni—Pt alloy layer in which nickel and platinum are mixed, annealing is performed. By the annealing, the Ni—Pt alloy layer is silicidated. The first metal silicide layer 54N is formed by the reaction between the Ni—Pt alloy layer and the crystalline undoped silicon layer 34N. The second metal silicide layer 54P is formed by the reaction between the Ni—Pt alloy layer and the crystalline third doped silicon layer 42P.

The first metal silicide layer 54N may also be formed on the first source region 46N and the first drain region 47N. The second metal silicide layer 54P may also be formed on the second source region 46P and the second drain region 47P.

By a series of processes described above, an NMOSFET and a PMOSFET are formed. The NMOSFET may include the first source region 46N, the first drain region 47N, the first channel 48N and the first gate structure 44N. The first gate structure 44N includes the first strained gate electrode TSG. The first channel 48N becomes a tensile stressed channel with a high tensile stress.

The PMOSFET may include the second source region 46P, the second drain region 47P, the second channel 48P and the second gate structure 44P. The second gate structure 44P includes the second strained gate electrode CSG. The second channel 48P becomes a compressive stressed channel with a local compressive stress.

The transistor according to the embodiments may be integrated in one transistor circuit together with a non-stressed channel transistor. The non-stressed channel transistor is a transistor having a channel that is not applied with a stress.

The transistor according to the embodiments may be applied to integrated circuits including transistors for various purposes. For example, the transistor according to the embodiments may be applied to an integrated circuit, such as an IGFET (insulated gate FET), an HEMT (high electron mobility transistor), a power transistor, a TFT (thin film transistor), and so forth.

The transistor and the integrated circuit according to the embodiments may be utilized in an electronic device. The electronic device may include a memory and a non-memory. The examples of memory that may utilize the embodiments of the present invention include an SRAM, a DRAM, a FLASH, an MRAM, an ReRAM, an STTRAM an FeRAM, or the like. The non-memory may include a logic circuit. The logic circuit may include a sense amplifier, a decoder, an input/output circuit, and so forth, for controlling a memory device. Also, the logic circuit may include various ICs other than a memory. For example, the logic circuit may include a microprocessor, an application processor for a mobile device, and so forth. Further, the non-memory may include a logic gate, such as a NAND gate, a driver IC for a display device, a power semiconductor device such as a power management IC (PMIC), and so forth. The electronic device may include a computing system, an image sensor, a camera, a mobile device, a display device, a sensor, a medical instrument, an optoelectronic device, an RFID (radio frequency identification), a photovoltaic cell, a semiconductor device for an automobile, a semiconductor device for a railroad car, a semiconductor device for an aircraft, and so forth.

Hereafter, various application examples including the transistor according to the embodiments will be described.

Figure 12:
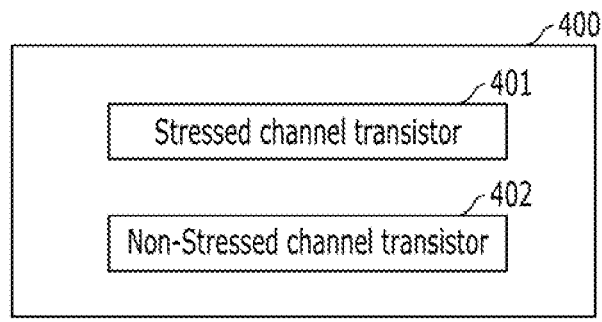
FIG. 12 is a diagram showing an integrated circuit including transistors according to the embodiments.

FIG. 12 is a diagram showing an integrated circuit including transistors according to the embodiments.

Referring to FIG. 12, an integrated circuit (IC) 400 includes a plurality of transistors. The integrated circuit 400 may include a plurality of stressed channel transistors 401 and a plurality of non-stressed channel transistors 402.

The stressed channel transistor's 401 include stressed channel transistors according to the embodiments. The stressed channel transistors 401 include stressed channels, which are formed in a stressed substrate, and strained gate electrodes, which include lattice-mismatched silicon layers. A local stress and a global stress are applied to the stressed channels by the strained gate electrodes and the stressed substrate.

Accordingly, the stressed channel transistors 401 and the non-stressed channel transistors 402 may be formed in one integrated circuit.

FIGS. 13A to 13D are diagrams showing various application examples of an integrated circuit including transistors according to the embodiments.

Figure 13A:
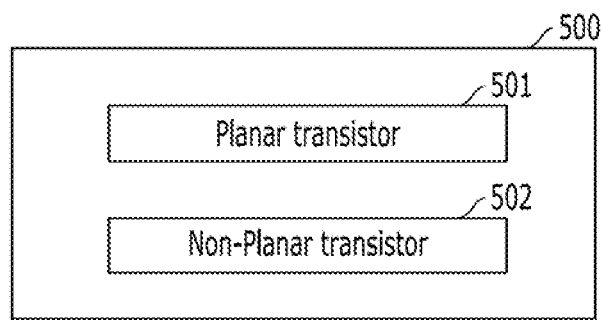
FIGS. 13A to 13D are diagrams showing various application examples of an integrated circuit including transistors according to the embodiments.

An integrated circuit 500 shown in FIG. 13A includes a plurality of planar transistors 501 and a plurality of non-planar transistors 502.

Figure 13B:
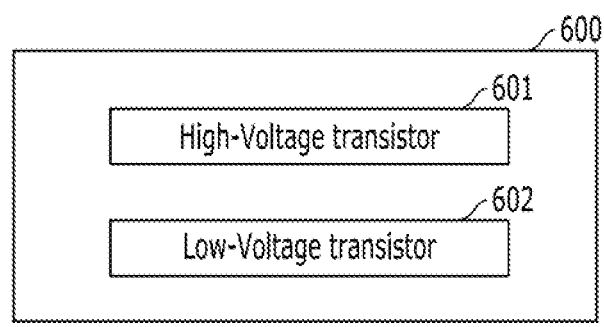
Figure 13C:
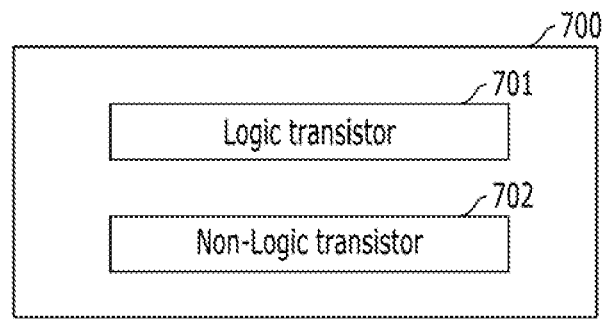

An integrated circuit 600 shown in FIG. 13B includes a plurality of high voltage transistors 601 and a plurality of low voltage transistors 602.

An integrated circuit 700 shown in FIG. 1.3C includes a plurality of logic transistors 701 and a plurality of non-logic transistors 702.

Figure 13D:
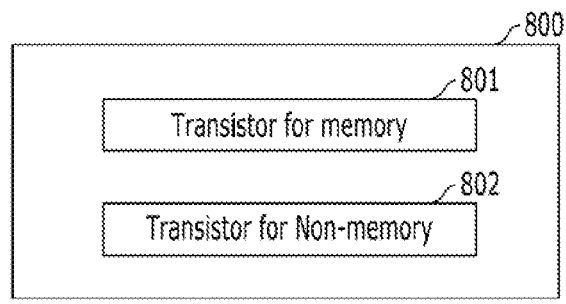

An integrated circuit 800 shown in FIG. 13D includes transistors 801 for a memory device and transistors 2 for a non-memory device.

The above-described planar transistors 501, non-planar transistors 502, high voltage transistors 601, low voltage transistors 602, logic transistors 701, non-logic transistors 702, transistors 801 for a memory device, and transistors 802 for a non-memory device may include stressed channel transistors according to the embodiments. The stressed channel transistors of the integrated circuits 500, 600, 700 and 800 include stressed channels, which are formed in a stressed substrate, and strained gate electrodes, which include lattice-mismatched silicon layers. A local stress and a global stress are applied to the stressed channels by the strained gate electrodes and the stressed substrate. As the result, the electron mobility and the driving current of the various transistors may increase, whereby the performance of the transistors may be improved. Therefore it may be possible to improve the performance of the integrated circuits 500, 600, 700 and 800 according to the embodiments of the present invention.

Figure 14:
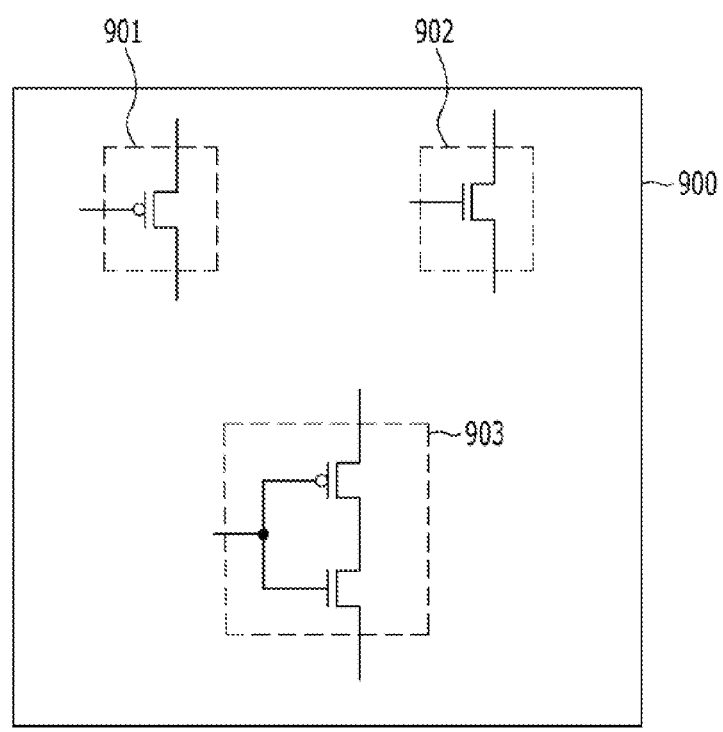
FIG. 14 is a diagram showing an electronic device including transistors according to the embodiments.

FIG. 14 is a diagram showing an electronic device including transistors according to the embodiments.

Referring to FIG. 14, an electronic device 900 includes a plurality of stressed channel transistors. The electronic device 900 may include a plurality of PMOSFETs 901, a plurality of NMOSFETs 902 and a plurality of CMOSFETs 903. The PMOSFETs 901, the NMOSFETs 902 and the CMOSFETs 903 may include stressed channel transistors according to the embodiments. The stressed channel transistors of the electronic device 900 include stressed channels, which are formed in a stressed substrate, and strained gate electrodes, which include lattice-mismatched silicon layers. A local stress and a global stress are applied to the stressed channels by the strained gate electrodes and the stressed substrate. Since the electronic device 900 includes the stressed channel transistors with improved performance, the electronic device 900 may realize a high operation speed in correspondence to scaling-down.

Figure 15:
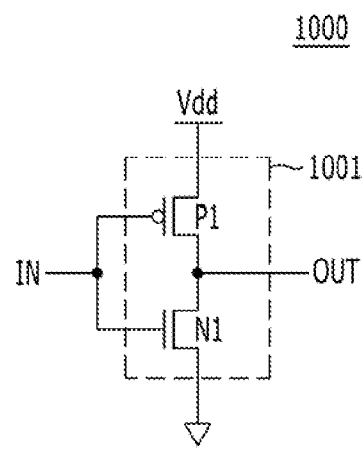
FIG. 15 is a circuit diagram showing an inverter including transistors according to the embodiments.

FIG. 15 is a circuit diagram showing an inverter including transistors according to the embodiments. FIG. 15 shows a CMOS inverter.

Referring to FIG. 15, an inverter 1000 may be formed of a CMOSFET 1001 including a PMOSFET P1 and an NMOSFET N1, which are sequentially coupled from a power supply terminal Vdd. The power supply terminal Vdd may be coupled to the drain of the PMOSFET P1, and a ground terminal may be coupled to the source of the NMOSFET N1. The CMOSFET 1001 of the inverter 1000 includes a stressed substrate, which includes a stressed N-channel and a stressed P-channel, a first strained gate electrode, which is formed on the stressed N-channel, and a second strained gate electrode, which is formed on the stressed P-channel. The first strained gate electrode and the second strained gate electrode include lattice-mismatched silicon layers that induce strains for respectively inducing different types of stresses to the stressed N-channel and the stressed P-channel.

Figure 16:
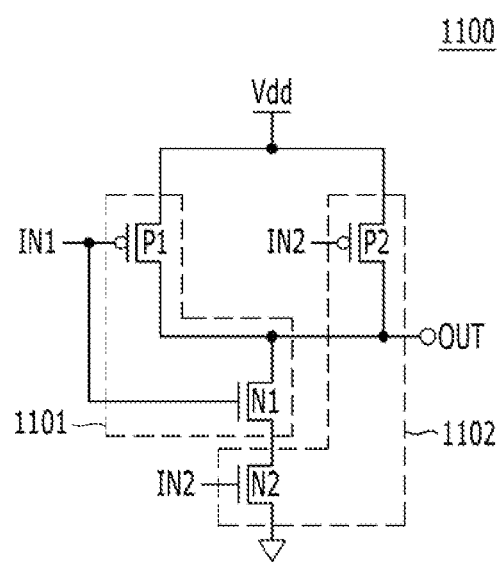
FIG. 16 is a circuit diagram showing a logic gate including transistors according to the embodiments.

FIG. 16 is a circuit diagram showing a logic gate including transistors according to the embodiments. FIG. 16 shows a NAND gate.

Referring to FIG. 16, a NAND gate 1100 includes a first CMOSFET 1101 and a second CMOSFET 1102 to which different input signal's IN1 and IN2 are transferred, respectively. The first CMOSFET 1101 includes a first PMOSFET P1 and a first NMOSFET N1 to which the first input signal IN1 is transferred. The second CMOSFET 1102 includes a second PMOSFET P2 and a second NMOSFET N2 to which the second input signal IN2 is transferred. Each of the first CMOSFET 1101 and the second CMOSFET 1102 of the NAND gate 1100 includes a stressed substrate, which includes a stressed N-channel and a stressed P-channel, a first strained gate electrode, which is formed on the stressed N-channel, and a second strained gate electrode, which is formed on the stressed P-channel. The first strained gate electrode and the second strained gate electrode include lattice-mismatched silicon layers that induce strains for respectively inducing different types of stresses to the stressed N-channel and the stressed P-channel.

Figure 17:
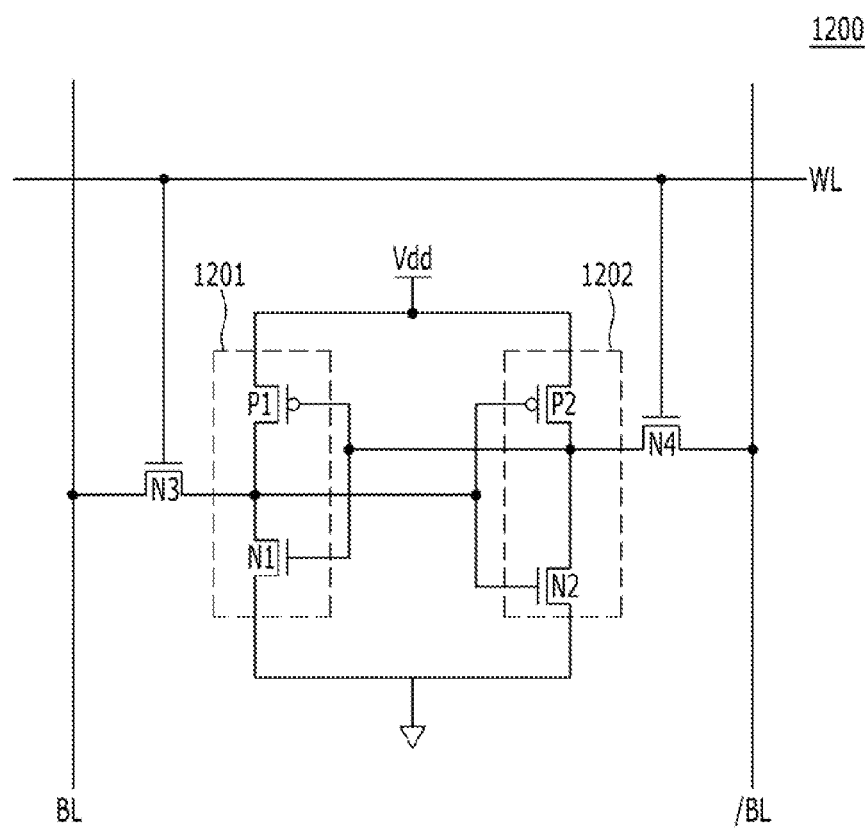
FIG. 17 is a circuit diagram showing a memory cell including transistors according to the embodiments.

FIG. 17 is a circuit diagram showing a memory cell including transistors according to the embodiments. FIG. 17 shows an SRAM cell.

Referring to FIG. 17, an SRAM cell 1200 includes a plurality of transistors. For example, the SRAM cell 1200 includes PMOSFETs P1 and P2, of which sources are coupled to a power supply terminal Vdd. Further, the SRAM cell 1200 includes NMOSFETs N1 and N2, of which sources are grounded. The drains of the PMOSFET P1 and the NMOSFET N1 are coupled with each other, and the drains of the PMOSFET P2 and the NMOSFET N2 are coupled with each other. That is to say, two CMOSFETs 1201 and 1202 are included in the SRAM cell 1200. Moreover, an NMOSFET N3 of which gate is coupled to a word line WL is coupled between the CMOSFET 1201 and a bit line BL. An NMOSFET N4 of which gate is coupled to the word line WL is coupled between the CMOSFET 1202 and a bit line bar /BL. In this way, the CMOSFETs 1201 and 1202 and the NMOSFETs N3 and N4 are included in the SRAM cell 1200.

In FIG. 17, the NMOSFETs N3 and N4 and the CMOSFETs 1201 and 1202 include stressed channel transistors according to the embodiments. Each of the CMOSFETs 1201 and 1202 includes a stressed substrate, which includes a stressed N-channel and a stressed P-channel, a first strained gate electrode, which is formed on the stressed N-channel, and a second strained gate electrode which is formed on the stressed P-channel. The first strained gate electrode and the second strained gate electrode include lattice-mismatched silicon layers that induce strains for respectively inducing different types of stresses to the stressed N-channel and the stressed P-channel. Each of the NMOSFETs N3 and N4 includes a stressed N-channel and a strained gate electrode that includes lattice-mismatched silicon layers, and a tensile stress is applied to the stressed N-channel by the strained gate electrode.

Accordingly, the SRAM cell 1200 in accordance with the embodiments of the present invention may operate at a higher speed when compared to the conventional SRAM cell.

Figure 18:
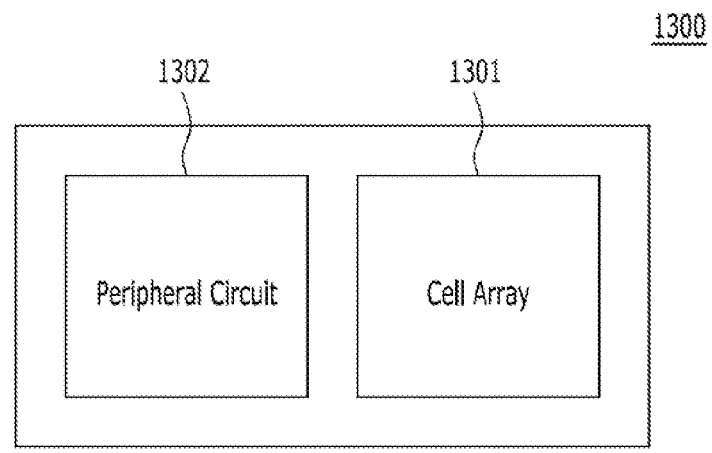
FIG. 18 is a diagram showing a memory device including transistors according to the embodiments.

FIG. 18 is a diagram showing a memory device including transistors according to the embodiments.

Referring to FIG. 18, a memory device 1300 may include a memory cell array 1301 and a peripheral circuit 1302. The memory cell array 1301 may include SRAM cells that include stressed channel transistors according to the embodiments of the present disclosure. Also, in the case where the memory cell array 1301 is a DRAM, a PRAM, an FeRAM or a flash memory, stressed channel transistors according to the embodiments may be applied to the peripheral circuit 1302. The peripheral circuit 1302 includes a decoder, a sense amplifier, an I/O circuit, and so forth. The peripheral circuit 1302 includes a plurality of transistors. The transistors of the peripheral circuit 1302 may include stressed channel transistors according to the embodiments. Each of the stressed channel transistors of the peripheral circuit 1302 includes a stressed channel that is formed in a stressed substrate, and a strained gate electrode that includes lattice-mismatched silicon layers.

Accordingly, the memory device 1300 including a plurality of stressed channel transistors according to embodiments of the present invention may operate at a high speed and may be scaled down due to stressed channels.

Although various exemplary implementations have been described for illustrative purposes, it will be apparent to those skilled in the art that various changes and modifications may be made without departing from the spirit and scope of the invention as defined in the following claims.

What is claimed is:
1. A semiconductor device comprising:
a stressed substrate stressed by a first stress;
a first stressed channel formed in the substrate and having the first stress induced from the stressed substrate;
a first strained gate electrode strained by a first strain generating element;
a second stressed channel formed in the substrate and having the first stress induced from the stressed substrate;
a second strained gate electrode strained by a second strain generating element; and
wherein a first strained gate electrode is formed over the first stressed channel, the first strained gate electrode including a first lattice-mismatched layer to induce a second stress to the first stressed channel,
wherein a second strained gate electrode is formed over the second stressed channel, the second strained gate electrode including a second lattice-mismatched layer to induce a third stress to the second stressed channel,
wherein the first lattice-mismatched layer comprises:
an arsenic-doped crystalline silicon layer doped with only arsenic; and
an undoped crystalline silicon layer formed over the arsenic doped crystalline silicon layer,
wherein the second lattice-mismatched layer comprises:
a boron-doped crystalline silicon layer; and
a germanium-doped crystalline silicon layer formed over the boron doped crystalline silicon layer,
wherein the boron-doped crystalline silicon layer is undoped with the germanium, and
wherein the germanium-doped crystalline silicon layer is undoped with the boron.

2. The semiconductor device according to claim 1, wherein the first stress and the second stress are a tensile stresses, and the first stressed channel has a tensile stress.

3. The semiconductor device according to claim 1, wherein the first stress comprises a tensile stress, the third stress comprises a compressive stress, and the second stressed channel has a compressive stress.

4. The semiconductor device according to claim 1, further comprising:
    metal silicide layers formed over the first strained gate electrode and the second strained gate electrode.

5. A transistor comprising:
    an NMOSFET including a tensile strained gate electrode that has a first lattice-mismatched crystalline silicon layer and a tensile stressed channel that has a tensile stress induced by a tensile strain; and
    a PMOSFET including a compressive strained gate electrode that has a second lattice-mismatched crystalline silicon layer and a compressively stressed channel that has a compressive stress induced by a compressive strain,
    wherein the tensile stressed channel and the compressive stressed channel are formed in a global tensile stressed substrate,
    wherein the global tensile stressed substrate applies a global tensile stress to the tensile stressed channel;
    wherein the first lattice-mismatched crystalline silicon layer comprises:
        an arsenic-doped crystalline silicon layer doped with only arsenic; and
        an undoped crystalline silicon layer formed over the arsenic-doped crystalline silicon layer,
    wherein the second lattice-mismatched crystalline silicon layer comprises:
        a boron-doped crystalline silicon layer; and
        a germanium-doped crystalline silicon layer formed over the boron-doped crystalline silicon layer,
    wherein the boron-doped crystalline silicon layer is undoped with the germanium, and
    wherein the germanium-doped crystalline silicon layer is undoped with the boron.

6. The transistor according to claim 5, further comprising:
    metal silicide layers formed over the tensile strained gate electrode and the compressive strained gate electrode, respectively.

* * * * *